US012379654B2

(12) United States Patent
Kim et al.

(10) Patent No.: US 12,379,654 B2
(45) Date of Patent: Aug. 5, 2025

(54) PELLICLE FOR EXTREME ULTRAVIOLET LITHOGRAPHY

(71) Applicant: KOREA ELECTRONICS TECHNOLOGY INSTITUTE, Seongnam-si (KR)

(72) Inventors: Hyeong Keun Kim, Yongin-si (KR); Seul Gi Kim, Yongin-si (KR); Hyun Mi Kim, Seoul (KR); Jin Woo Cho, Seoul (KR); Ki Hun Seong, Anyang-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 694 days.

(21) Appl. No.: 17/698,455

(22) Filed: Mar. 18, 2022

(65) Prior Publication Data

US 2022/0334464 A1 Oct. 20, 2022

(30) Foreign Application Priority Data

Apr. 14, 2021 (KR) ........................ 10-2021-0048288

(51) Int. Cl.

| | |
|---|---|
| ***G03F 1/52*** | (2012.01) |
| ***G03F 1/62*** | (2012.01) |
| ***G03F 1/64*** | (2012.01) |
| ***G03F 7/00*** | (2006.01) |

(52) U.S. Cl.

CPC .................. *G03F 1/64* (2013.01); *G03F 1/62* (2013.01); *G03F 7/70033* (2013.01); *G03F 7/70983* (2013.01)

(58) Field of Classification Search

CPC .................................... G03F 1/62; G03F 1/64

USPC .............................................................. 430/5

See application file for complete search history.

(56) References Cited

U.S. PATENT DOCUMENTS

| | | | | |
|---|---|---|---|---|
| 9,547,232 | B2 | 1/2017 | Levinson et al. | |
| 10,768,523 | B2 * | 9/2020 | Nam | G03F 1/64 |
| 11,106,127 | B2 * | 8/2021 | Lin | G03F 1/22 |
| 11,467,486 | B2 * | 10/2022 | Kurganova | G03F 7/70983 |
| 12,248,243 | B2 * | 3/2025 | Kim | G03F 7/70983 |
| 2013/0250260 | A1 | 9/2013 | Singh | |
| 2017/0176850 | A1 | 6/2017 | Chen et al. | |
| 2017/0227843 | A1 | 8/2017 | Lee et al. | |
| 2021/0096458 | A1 | 4/2021 | Nam et al. | |

(Continued)

FOREIGN PATENT DOCUMENTS

| | | |
|---|---|---|
| CN | 107731939 A | 2/2018 |
| CN | 108121153 A | 6/2018 |

(Continued)

OTHER PUBLICATIONS

Office Action dated Jun. 13, 2023 in Korean Application No. 10-2021-0048288.

(Continued)

*Primary Examiner* — Martin J Angebranndt

(74) *Attorney, Agent, or Firm* — Knobbe, Martens, Olson & Bear, LLP

(57) ABSTRACT

This application relates to a pellicle for extreme ultraviolet lithography used in a lithography process using extreme ultraviolet rays. In one aspect, the pellicle includes a pellicle layer formed of an M-α material in which M is combined with α. Here, M is one of Si, Zr, Mo, Ru, Y, W, Ti, Ir, or Nb, and α is at least two of B, N, C, O, or F.

12 Claims, 38 Drawing Sheets

(56) References Cited

U.S. PATENT DOCUMENTS

| | | | | |
|---|---|---|---|---|
| 2022/0146949 | A1* | 5/2022 | Kim | G03F 7/70983 |
| 2022/0326600 | A1* | 10/2022 | Kim | G03F 1/62 |
| 2022/0326601 | A1* | 10/2022 | Kim | G03F 1/22 |
| 2022/0326602 | A1* | 10/2022 | Kim | C01B 32/184 |
| 2023/0125229 | A1* | 4/2023 | Kim | G03F 7/2004<br>430/271.1 |

FOREIGN PATENT DOCUMENTS

| | | | |
|---|---|---|---|
| CN | 108132582 | A | 6/2018 |
| DE | 10-2017-202861 | A1 | 4/2017 |
| EP | 3373070 | A1 | 9/2018 |
| JP | 2010-256434 | A | 11/2010 |
| JP | 2018-151622 | A | 9/2018 |
| JP | 2019-028462 | A | 2/2019 |
| JP | 2019-515322 | A | 6/2019 |
| KR | 10-2018-0094084 | A | 8/2018 |
| KR | 10-2018-0103775 | A | 9/2018 |
| KR | 10-2018-0135490 | A | 12/2018 |
| KR | 10-2020-0126216 | A | 11/2020 |
| KR | 10-2021-0031664 | A | 3/2021 |
| KR | 10-2021-0036770 | A | 4/2021 |
| KR | 102282184 | B1 * | 7/2021 |
| KR | 102317053 | B1 * | 10/2021 |
| TW | 201606439 | A | 2/2016 |
| TW | 201725178 | A | 7/2017 |
| TW | 201730692 | A | 9/2017 |
| WO | 2014/188710 | A1 | 11/2014 |
| WO | 2016/043301 | A1 | 3/2016 |
| WO | 2017/175019 | A1 | 3/2016 |
| WO | 2017/102379 | A1 | 6/2017 |
| WO | 2017/179199 | A1 | 10/2017 |
| WO | WO-2021194032 | A1 * | 9/2021 |

OTHER PUBLICATIONS

Office Action dated May 16, 2023 in Japanese Application No. 2022-064515.

Second Office Action in Korean Patent Application No. 10-2021-0048288 issued on Dec. 27, 2023.

Office Action in Taiwanese Patent Application No. 111113321 issued on Apr. 22, 2024, 5 pages.

Extended European Search Report in EP Application No. 22165584.8 dated Sep. 9, 2022.

* cited by examiner

PELLICLE FOR EXTREME ULTRAVIOLET LITHOGRAPHY

CROSS-REFERENCE TO RELATED APPLICATION

The present application claims priority to Korean Patent Application No. 10-2021-0048288 filed on Apr. 14, 2021 in the Korean Intellectual Property Office, which is incorporated herein in its entirety by reference.

BACKGROUND

Technical Field

The present disclosure relates to a semiconductor lithography technology. More particularly, the present disclosure relates to a pellicle for extreme ultraviolet lithography used in a lithography process using extreme ultraviolet rays.

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of light. Extreme ultraviolet (EUV) lithography technology, recently developed as a next-generation technology, can realize a fine pattern through a single resist process.

SUMMARY

The present disclosure provides a pellicle for extreme ultraviolet lithography having an extreme ultraviolet transmittance of 90% or more in an extreme ultraviolet output environment of 350 W or more.

In addition, the present disclosure provides a pellicle for extreme ultraviolet lithography having thermal stability, mechanical stability and chemical durability while having a high extreme ultraviolet transmittance of 90% or more.

According to embodiments of the present disclosure, a pellicle for extreme ultraviolet lithography may include a pellicle layer formed of an M-α material in which M is combined with α, wherein M is one of Si, Zr, Mo, Ru, Y, W, Ti, Ir, and Nb, and α is at least two of B, N, C, O, and F.

In the pellicle, when M is Nb and α is B and C, the pellicle layer may be formed by selecting and combining two or more from among $NbB_x$ (x≥1), $NbC_x$ (x≥1), and $B_4C$ so that all of Nb, B, and C are contained.

In the pellicle, when M is Si and α is B, N, and C, the pellicle layer may be formed by selecting and combining two or more from among $SiB_xN_y$ (x+y≥2), $SiB_x$ (x≥3), SiC, $SiN_x$ (x≥1), and BN so that all of Si, B, N, and C are contained.

In the pellicle, when M is Y and α is B, N, O, and F, the pellicle layer may be formed by selecting and combining two or more from among YOF, $YB_xN_y$ (x+y≥1), $YO_xN_y$ (x+y≥1), $YB_x$ (x≥2), YN, $Y_2O_3$, and $YF_3$ so that all of Y, B, N, O, and F are contained.

In the pellicle, the pellicle layer may include a support layer; a core layer formed on the support layer; and a capping layer formed on the core layer, wherein each of the support layer, the core layer, and the capping layer is formed of a combination of M and α.

In the pellicle, a material of the core layer may be $SiB_xN_{1-x}$ (0<x<1), and a material of the support layer and the capping layer may be $SiN_x$ (x≥1).

In the pellicle, a material of the core layer may be $SiB_{6x}N_{1-x}$ (0<x<1), and a materials of the support layer and the capping layer may be $SiN_x$ (x≥1).

In the pellicle, a material of the core layer may be $YB_{2x}N_{1-x}$ (0<x<1), and a material of the support layer and the capping layer may be $SiN_x$ (x≥1).

In the pellicle, a material of the core layer may be $YB_{2x}N_{1-x}$ (0<x<1), and a material of the support layer and the capping layer may be $YB_x$ (x≥2).

In the pellicle, the pellicle layer may include a support layer; a core layer formed on the support layer; an intermediate layer formed on one or both surfaces of the core layer; and a capping layer formed on the intermediate layer, wherein each of the support layer, the core layer, the intermediate layer, and the capping layer is formed of a combination of M and α.

According to embodiments of the present disclosure, a pellicle for extreme ultraviolet lithography may include a substrate having an opening formed in a central portion thereof; and a pellicle layer formed on the substrate to cover the opening and formed of an M-α material in which M is combined with α, wherein M is one of Si, Zr, Mo, Ru, Y, W, Ti, Ir, and Nb, and α is at least two of B, N, C, O, and F.

In the pellicle, the pellicle layer may include a support layer formed on the substrate to cover the opening; a core layer formed on the support layer; and a capping layer formed on the core layer, wherein each of the support layer, the core layer, and the capping layer is formed of a combination of M and α.

In the pellicle, the pellicle layer may include a support layer formed on the substrate to cover the opening; a core layer formed on the support layer; an intermediate layer formed on one or both surfaces of the core layer; and a capping layer formed on the intermediate layer, wherein each of the support layer, the core layer, the intermediate layer, and the capping layer is formed of a combination of M and α.

According to the present disclosure, because the pellicle layer includes the M-α material, it is possible to provide a high extreme ultraviolet transmittance of 90% or more and an extreme ultraviolet reflectance of 0.04% or less.

In addition, the pellicle according to the present disclosure may provide thermal stability, mechanical stability, and chemical durability while having a high extreme ultraviolet transmittance of 90% or more and an extreme ultraviolet reflectance of 0.04% or less. That is, because the pellicle layer includes the M-α material which is a metal-based compound that contains Si having high optical properties or Y having chemical durability and mechanical stability, B capable of reinforcing mechanical strength, and N, C, O, or F capable of reinforcing optical properties and chemical resistance, it can provide thermal stability, mechanical stability, and chemical durability while having a high extreme ultraviolet transmittance of 90% or more and an extreme ultraviolet reflectance of 0.04% or less.

DETAILED DESCRIPTION

Figure 1:
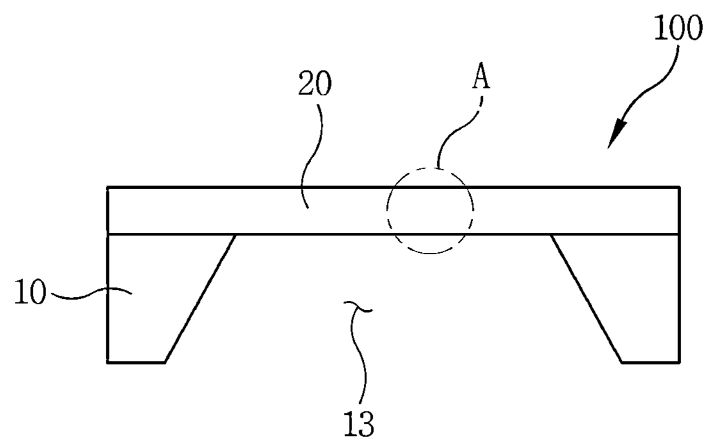
FIG. 1 is a cross-sectional view showing a pellicle for extreme ultraviolet lithography according to a first embodiment of the present disclosure.

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography machine.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20 G inside the extreme ultraviolet lithography apparatus, and thermal stability that the pellicle can withstand a thermal load of 250 W or more based on a 5 nm node are required. Also, chemical durability that the pellicle does not react to hydrogen radicals generated in an extreme ultraviolet environment is required.

Currently, pellicle development companies are developing transmissive materials based on polycrystalline silicon (p-Si) or SiN. However, such materials do not satisfy a transmittance of 90% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

Recently, a pellicle having an extreme ultraviolet transmittance of 90% or more and thermal, chemical, and mechanical stability in an extreme ultraviolet output environment of 350 W or more, exceeding an irradiation intensity of 250 W level, is required.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

First Embodiment

Figure 2:
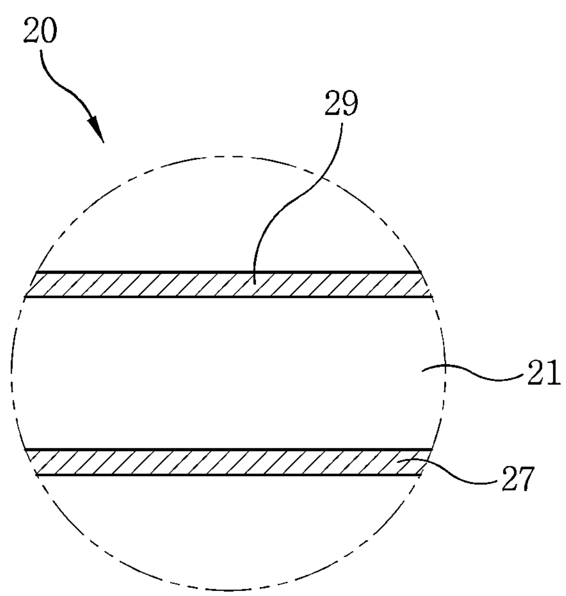
FIG. 2 is an enlarged view of part A of FIG. 1.

FIG. 1 is a cross-sectional view showing a pellicle for extreme ultraviolet lithography according to a first embodiment of the present disclosure. FIG. 2 is an enlarged view of part A of FIG. 1.

Referring to FIGS. 1 and 2, a pellicle 100 for extreme ultraviolet lithography according to the first embodiment (hereinafter referred to as 'pellicle') includes a pellicle layer 20 formed of an M-$\alpha$ material in which M is combined with $\alpha$. Here, M is one of Si, Zr, Mo, Ru, Y, W, Ti, Ir, and Nb. Also, $\alpha$ is at least two of B, N, C, O, and F.

This pellicle layer 20 may be configured as follows.

For example, when M is Nb and $\alpha$ is B and C, the pellicle layer 20 may be formed by selecting and combining two or more from among $NbB_x$ ($x \geq 1$), $NbC_x$ ($x \geq 1$), and $B_4C$ so that all of Nb, B, and C are contained.

When M is Si and $\alpha$ is B, N, and C, the pellicle layer 20 may be formed by selecting and combining two or more from among $SiB_xN_y$ ($x+y \geq 2$), $SiB_x$ ($x \geq 3$), SiC, $SiN_x$ ($x \geq 1$), and BN so that all of Si, B, N, and C are contained.

When M is Y and $\alpha$ is B, N, O, and F, the pellicle layer 20 may be formed by selecting and combining two or more from among YOF, $YB_xN_y$ ($x+y \geq 1$), $YO_xN_y$ ($x+y \geq 1$), $YB_x$ ($x \geq 2$), YN, $Y_2O_3$, and $YF_3$ so that all of Y, B, N, O, and F are contained.

The pellicle 100 according to the first embodiment includes a substrate 10 having an opening 13 formed in its central portion, and the pellicle layer 20 formed on the substrate 10 to cover the opening 13. The pellicle layer 20 may include a support layer 27, a core layer 21, and a capping layer 29, which are formed by being stacked on the substrate 10.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The substrate 10 supports the pellicle layer 20 and makes it easy to handle and transport the pellicle 100 during and after the process of manufacturing the pellicle 100. The substrate 10 may be formed of a material such as silicon available for an etching process. For example, the material of the substrate 10 includes, but is not limited to, silicon, silicon oxide, silicon nitride, metal oxide, metal nitride, graphite, amorphous carbon, or a laminated structure of such materials. Here, metal may be, but is not limited to, Cr, Al, Zr, Ti, Ta, Nb, Ni, or the like.

The opening 13 in the central portion of the substrate 10 may be formed using a micro-machining technique such as micro-electro mechanical systems (MEMS). That is, the opening 13 is formed by removing the central portion of the substrate 10 by means of the micro-machining technique. The opening 13 partially exposes the pellicle layer 20.

The pellicle layer 20 includes the support layer 27, the core layer 21, and the capping layer 29.

The support layer 27 is formed on the substrate 10 to cover the opening 13 of the substrate 10. The support layer 27 is formed of a material having resistance to KOH, and also functions to prevent the material of the core layer 21 from being diffused into the substrate 10. The support layer 27 may be formed by a chemical vapor deposition (CVD) process, but it is formed by an atomic layer deposition (ALD) process, an e-beam evaporation process, or a sputtering process so as to have the best transmittance and minimize defects through free control of thickness, physical properties, and chemical composition. The support layer 27 may be formed on the substrate 10 to have a thickness of 1 nm to 10 nm.

The core layer 21 is formed on the support layer 27. The core layer 21 is a layer that determines the transmittance of extreme ultraviolet rays. The core layer 21 has a transmittance of 90% or more for extreme ultraviolet rays, and effectively dissipates heat to prevent overheating of the pellicle layer 20.

In addition, the capping layer 29 provides thermal stability, mechanical stability, and chemical durability to the pellicle layer 20 while minimizing a decrease in the transmittance of the core layer 21 for extreme ultraviolet rays. Specifically, the capping layer 29 is a protective layer for the core layer 21 and provides thermal stability by effectively dissipating heat generated in the core layer 21 to the outside. Also, the capping layer 29 provides mechanical stability by supplementing the mechanical strength of the core layer 21. Further, the capping layer 29 provides chemical durability by protecting the core layer 21 from hydrogen radicals and oxidation.

Each of the support layer 27, the core layer 21, and the capping layer 29 constituting the pellicle layer 20 is formed of a combination of M and α.

For example, the material of the core layer 21 may be $SiB_xN_{1-x}$ ($0<x<1$), and the materials of the support layer 27 and the capping layer 29 may be $SiN_x$ ($x\geq1$).

Alternatively, the material of the core layer 21 may be $SiB_{6x}N_{1-x}$ ($0<x<1$), and the materials of the support layer 27 and the capping layer 29 may be $SiN_x$ ($x\geq1$).

Alternatively, the material of the core layer 21 may be $YB_{2x}N_{1-x}$ ($0<x<1$), and the materials of the support layer 27 and the capping layer 29 may be $SiN_x$ ($x\geq1$).

In a conventional pellicle, there was a need to form the capping layer to a thickness of 5 nm or less in order to ensure a high extreme ultraviolet transmittance. However, in the first embodiment, by using the material combining M and α as the material of the capping layer 29, for example, using a material selected from YOF, $YB_xN_y$ ($x+y\geq1$), $YO_xN_y$ ($x+y\geq1$), $SiB_xN_y$ ($x+y\geq2$), $SiB_x$ ($x\geq3$), SiC, $SiN_x$ ($x\geq1$), $YB_x$ ($x\geq2$), YN, $Y_2O_3$, $YF_3$, BN, $NbB_x$ ($x\geq1$), $NbC_x$ ($x\geq1$), and $B_4C$, it is possible to provide the pellicle 100 not only having a high extreme ultraviolet transmittance of 90% or more but also having thermal stability, mechanical stability and chemical durability even if the capping layer 29 is formed to a thickness of 10 nm.

As such, because the pellicle layer 20 includes the M-α material in the pellicle 100 according to the first embodiment, it is possible to provide a high extreme ultraviolet transmittance of 90% or more and an extreme ultraviolet reflectance of 0.04% or less.

In addition, the pellicle 100 according to the first embodiment may provide thermal stability, mechanical stability, and chemical durability while having a high extreme ultraviolet transmittance of 90% or more and an extreme ultraviolet reflectance of 0.04% or less. That is, because the pellicle layer 20 includes the M-α material which is a metal-based compound that contains Si having high optical properties or Y having chemical durability and mechanical stability, B capable of reinforcing mechanical strength, and N, C, O, or F capable of reinforcing optical properties and chemical resistance, it can provide thermal stability, mechanical stability, and chemical durability while having a high extreme ultraviolet transmittance of 90% or more and an extreme ultraviolet reflectance of 0.04% or less.

The above-described pellicle 100 according to the first embodiment may be manufactured by the following manufacturing process. First, in order to form the pellicle layer 20, the support layer 27, the core layer 21, and the capping layer 29 are sequentially stacked on the substrate 10 in which the opening 13 is not formed.

At this time, each of the first support layer 27, the core layer 21, and the capping layer 29 may be formed by a CVD process, an ALD process, an e-beam evaporation process, or a sputtering process.

Thereafter, by removing the central portion of the substrate 10 under the pellicle layer 20 to form the opening 13 through which a lower surface of the pellicle layer 20 is partially exposed, the pellicle 100 according to the first embodiment can be obtained. That is, the opening 13 is formed by removing the central portion of the substrate 10 under the support layer 27 through wet etching.

Second Embodiment

Figure 3:
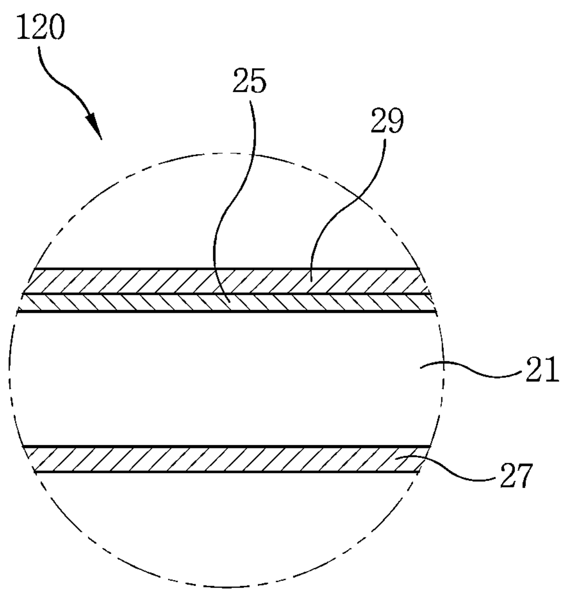
FIG. 3 is an enlarged view showing a pellicle for extreme ultraviolet lithography according to a second embodiment of the present disclosure.

FIG. 3 is an enlarged view showing a pellicle for extreme ultraviolet lithography according to a second embodiment of the present disclosure.

Referring to FIG. 3, a pellicle according to the second embodiment includes a pellicle layer 120 formed of an M-α material in which M is combined with α. Here, M is one of Si, Zr, Mo, Ru, Y, W, Ti, Ir, and Nb. Also, α is at least two of B, N, C, O, and F.

The pellicle layer 120 includes a support layer 27, a core layer 21, an intermediate layer 25, and a capping layer 29, which are formed by being stacked on the substrate 10. The intermediate layer 25 may be formed on one or both surfaces of the core layer 21. That is, the support layer 27 is formed on the substrate 10 to cover the opening 13 of the substrate 10. The core layer 21 is formed on the support layer 27. The intermediate layer 25 is formed on the core layer 21. The capping layer 29 is formed on the intermediate layer 25.

The pellicle according to the second embodiment has the same structure as the pellicle (100 in FIG. 1) according to the first embodiment except that the intermediate layer 25 is added.

The intermediate layer 25 as well included in the pellicle layer 120 is formed of a combination of M and α.

In a conventional pellicle, there was a need to form the intermediate layer to a thickness of 5 nm or less in order to ensure a high extreme ultraviolet transmittance. However, in the second embodiment, by using the material combining M and α as the material of the intermediate layer 25, for example, using a material selected from YOF, $YB_xN_y$ ($x+y\geq1$), $YO_xN_y$ ($x+y\geq1$), $SiB_xN_y$ ($x+y\geq2$), $SiB_x$ ($x\geq3$), SiC, $SiN_x$ ($x\geq1$), $YB_x$ ($x\geq2$), YN, $Y_2O_3$, $YF_3$, BN, $NbB_x$ ($x\geq1$), $NbC_x$ ($x\geq1$), and $B_4C$, it is possible to provide the pellicle not only having a high extreme ultraviolet transmittance of 90% or more but also having thermal stability, mechanical stability and chemical durability even if the intermediate layer 25 is formed to a thickness of 10 nm.

The above-described pellicle according to the second embodiment may be manufactured by the following manufacturing process. First, in order to form the pellicle layer 120, the support layer 27, the core layer 21, the intermediate layer 25, and the capping layer 29 are sequentially stacked on the substrate 10 in which the opening 13 is not formed.

At this time, each of the support layer 27, the core layer 21, the intermediate layer 25, and the capping layer 29 may be formed by a CVD process, an ALD process, an e-beam evaporation process, or a sputtering process.

Thereafter, by removing the central portion of the substrate 10 under the pellicle layer 120 to form the opening 13 through which a lower surface of the pellicle layer 120 is partially exposed, the pellicle according to the second embodiment can be obtained. That is, the opening 13 is formed by removing the central portion of the substrate 10 under the support layer 27 through wet etching.

As such, because the pellicle layer 120 includes the M-α material in the pellicle according to the second embodiment, it is possible to provide a high extreme ultraviolet transmittance of 90% or more and an extreme ultraviolet reflectance of 0.04% or less.

In addition, the pellicle according to the second embodiment may provide thermal stability, mechanical stability, and chemical durability while having a high extreme ultraviolet transmittance of 90% or more and an extreme ultraviolet reflectance of 0.04% or less.

Third Embodiment

Figure 4:
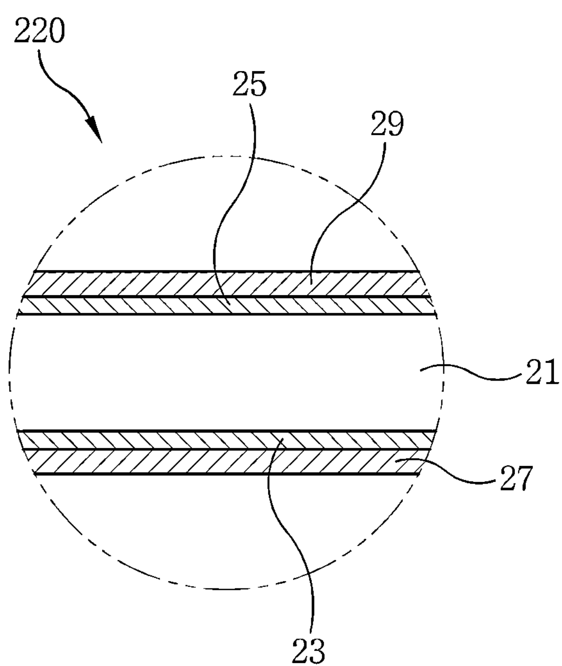
FIG. 4 is an enlarged view showing a pellicle for extreme ultraviolet lithography according to a third embodiment of the present disclosure.

FIG. 4 is an enlarged view showing a pellicle for extreme ultraviolet lithography according to a third embodiment of the present disclosure.

Referring to FIG. 4, a pellicle according to the third embodiment includes a pellicle layer 220 formed of an M-α material in which M is combined with α. Here, M is one of Si, Zr, Mo, Ru, Y, W, Ti, Ir, and Nb. Also, α is at least two of B, N, C, O, and F.

The pellicle layer 220 includes a support layer 27, a first intermediate layer 23, a core layer 21, a second intermediate layer 25, and a capping layer 29, which are formed by being stacked on the substrate 10. The first and second intermediate layers 23 and 25 are formed on both surfaces of the core layer 21, respectively. That is, the support layer 27 is formed on the substrate 10 to cover the opening 13 of the substrate 10. The first intermediate layer 23 is formed on the support layer 27. The core layer 21 is formed on the first intermediate layer 23. The second intermediate layer 25 is formed on the core layer 21. The capping layer 29 is formed on the second intermediate layer 25.

The pellicle according to the third embodiment has the same structure as the pellicle (100 in FIG. 1) according to the first embodiment except that the first and second intermediate layers 23 and 25 are added.

The first and second intermediate layers 23 and 25 as well included in the pellicle layer 220 are formed of a combination of M and α.

In a conventional pellicle, there was a need to form the intermediate layer to a thickness of 5 nm or less in order to ensure a high extreme ultraviolet transmittance. However, in the third embodiment, by using the material combining M and α as the material of the first and second intermediate layers 23 and 25, for example, using a material selected from YOF, $YB_xN_y$ ($x+y\geq1$), $YO_xN_y$ ($x+y\geq1$), $SiB_xN_y$ ($x+y\geq2$), $SiB_x$ ($x\geq3$), SiC, $SiN_x$ ($x\geq1$), $YB_x$ ($x\geq2$), YN, $Y_2O_3$, $YF_3$, BN, $NbB_x$ ($x\geq1$), $NbC_x$ ($x\geq1$), and $B_4C$, it is possible to provide the pellicle not only having a high extreme ultraviolet transmittance of 90% or more but also having thermal stability, mechanical stability and chemical durability even if the first and second intermediate layers 23 and 25 are formed to a thickness of 10 nm.

The above-described pellicle according to the third embodiment may be manufactured by the following manufacturing process. First, in order to form the pellicle layer 220, the support layer 27, the first intermediate layer 23, the core layer 21, the second intermediate layer 25, and the capping layer 29 are sequentially stacked on the substrate 10 in which the opening 13 is not formed.

At this time, each of the support layer 27, the first intermediate layer 23, the core layer 21, the second intermediate layer 25, and the capping layer 29 may be formed by a CVD process, an ALD process, an e-beam evaporation process, or a sputtering process.

Thereafter, by removing the central portion of the substrate 10 under the pellicle layer 220 to form the opening 13 through which a lower surface of the pellicle layer 220 is partially exposed, the pellicle according to the third embodiment can be obtained. That is, the opening 13 is formed by removing the central portion of the substrate 10 under the support layer 27 through wet etching.

As such, because the pellicle layer 220 includes the M-α material in the pellicle according to the third embodiment, it is possible to provide a high extreme ultraviolet transmittance of 90% or more and an extreme ultraviolet reflectance of 0.04% or less.

In addition, the pellicle according to the third embodiment may provide thermal stability, mechanical stability, and chemical durability while having a high extreme ultraviolet transmittance of 90% or more and an extreme ultraviolet reflectance of 0.04% or less.

Experimental Examples

In order to check the transmittance and reflectance of the pellicle according to the present disclosure in an extreme ultraviolet output environment of 350 W or more, simulations were performed on the pellicles according to first to thirty-sixth experimental examples as shown in FIGS. 5 to 40.

The pellicles according to the first to thirty-sixth experimental examples include the pellicle layer according to the first embodiment. That is, the pellicle layer includes the support layer, the core layer, and the capping layer.

When the thickness of the support layer is 5 nm, the transmittance and reflectance of the pellicle according to each of the first to thirty-sixth experimental examples were simulated in an extreme ultraviolet output environment of 350 W while changing the thickness of the core layer between 0 nm and 30 nm and the thickness of the capping layer between 0 nm and 10 nm.

First to Ninth Experimental Examples

FIGS. 5 to 13 are graphs showing transmittance and reflectance of a pellicle for extreme ultraviolet lithography according to first to ninth experimental examples of the present disclosure.

In the pellicle layers according to the first to ninth experimental examples, Si was used as M, and B and N were used as $\alpha$. Here, the material of the support layer is $SiN_x$. The material of the core layer is $SiB_xN_{1-x}$ (0<x<1). The material of the capping layer is $SiN_x$.

The pellicles according to the first to ninth experimental examples were expressed as "SiN_SiBaNb_SiN(5 nm)". Here, 'SiN(5 nm)' denotes the support layer. Also, 'SiBaNb' denotes the core layer. And, 'SiN' denotes the capping layer.

Figure 5:
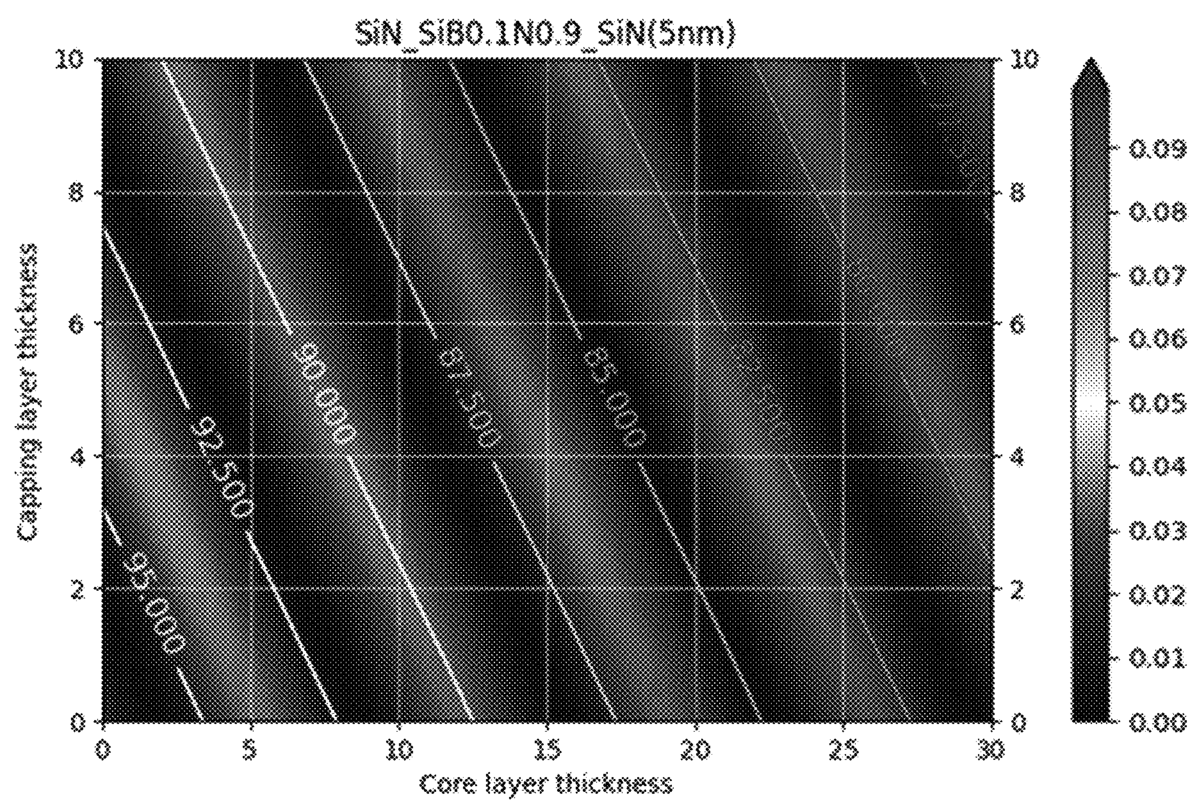
FIGS. 5 to 13 are graphs showing transmittance and reflectance of a pellicle for extreme ultraviolet lithography according to first to ninth experimental examples of the present disclosure.

Referring to FIG. 5, the pellicle according to the first experimental example was expressed as "SiN_SiB0.1N0.9_SiN(5 nm)".

When the thickness of the core layer is 13 nm or less and the thickness of the capping layer is 10 nm or less, the transmittance is 90% or more.

In addition, when the thickness of the core layer is 30 nm or less and the thickness of the capping layer is 10 nm or less, the reflectance is 0.05% or less.

Figure 6:
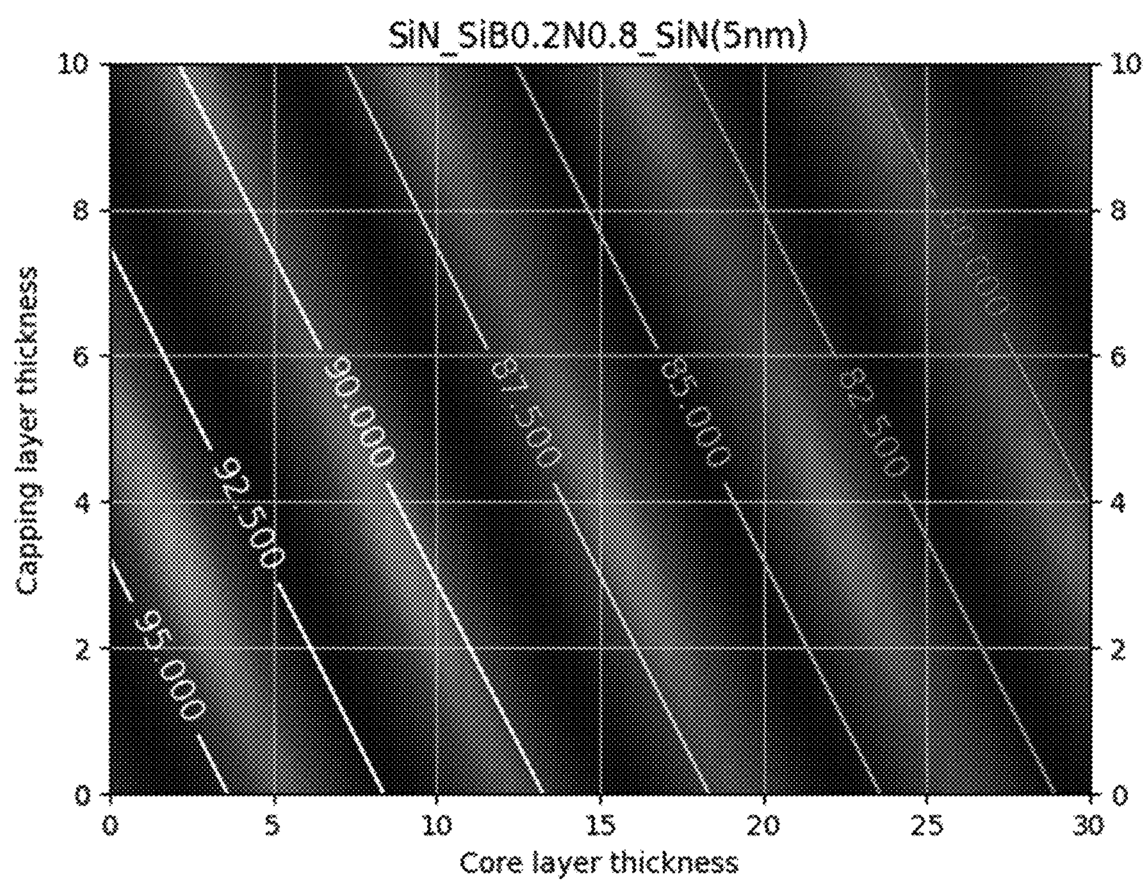

Referring to FIG. 6, the pellicle according to the second experimental example was expressed as "SiN_SiB0.2N0.8_SiN(5 nm)".

When the thickness of the core layer is 14 nm or less and the thickness of the capping layer is 10 nm or less, the transmittance is 90% or more.

In addition, when the thickness of the core layer is 30 nm or less and the thickness of the capping layer is 10 nm or less, the reflectance is 0.05% or less.

Figure 7:
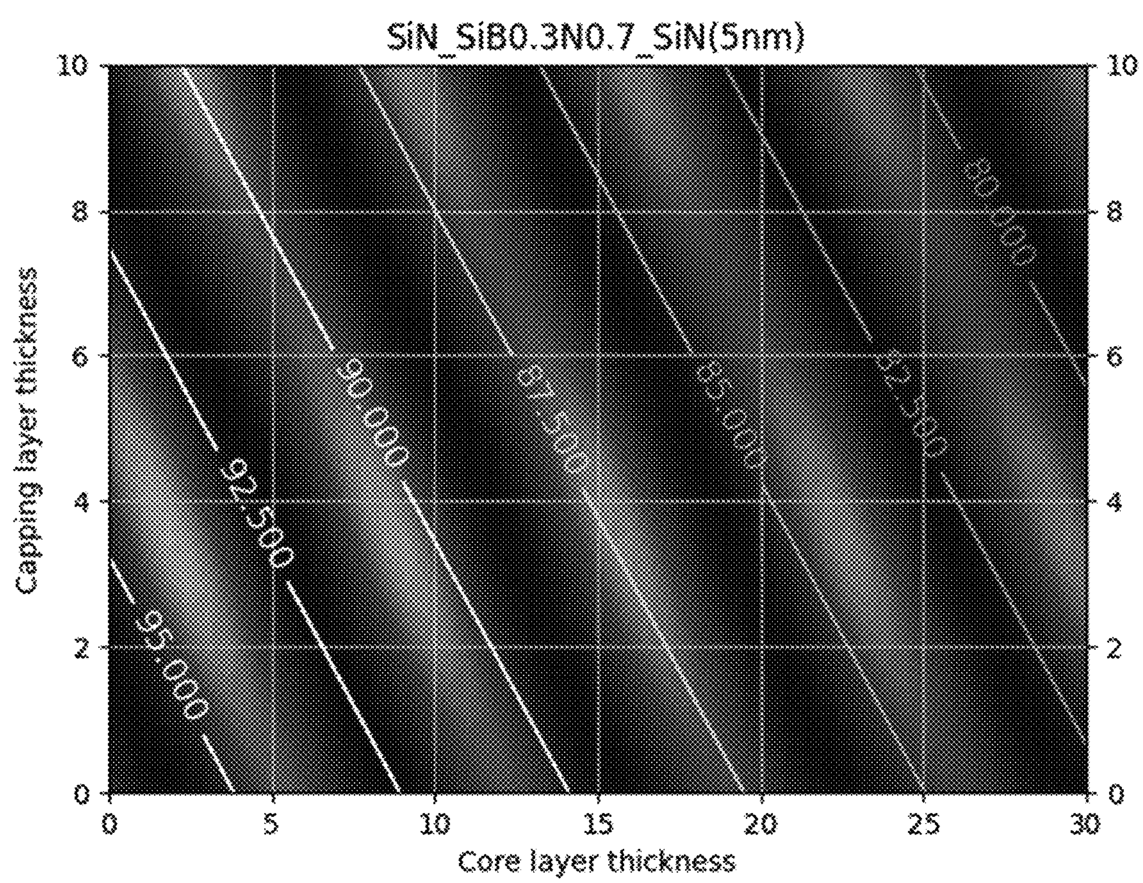

Referring to FIG. 7, the pellicle according to the third experimental example was expressed as "SiN_SiB0.3N0.7_SiN(5 nm)".

When the thickness of the core layer is less than 15 nm and the thickness of the capping layer is 10 nm or less, the transmittance is 90% or more.

In addition, when the thickness of the core layer is 30 nm or less and the thickness of the capping layer is 10 nm or less, the reflectance is 0.05% or less.

Figure 8:
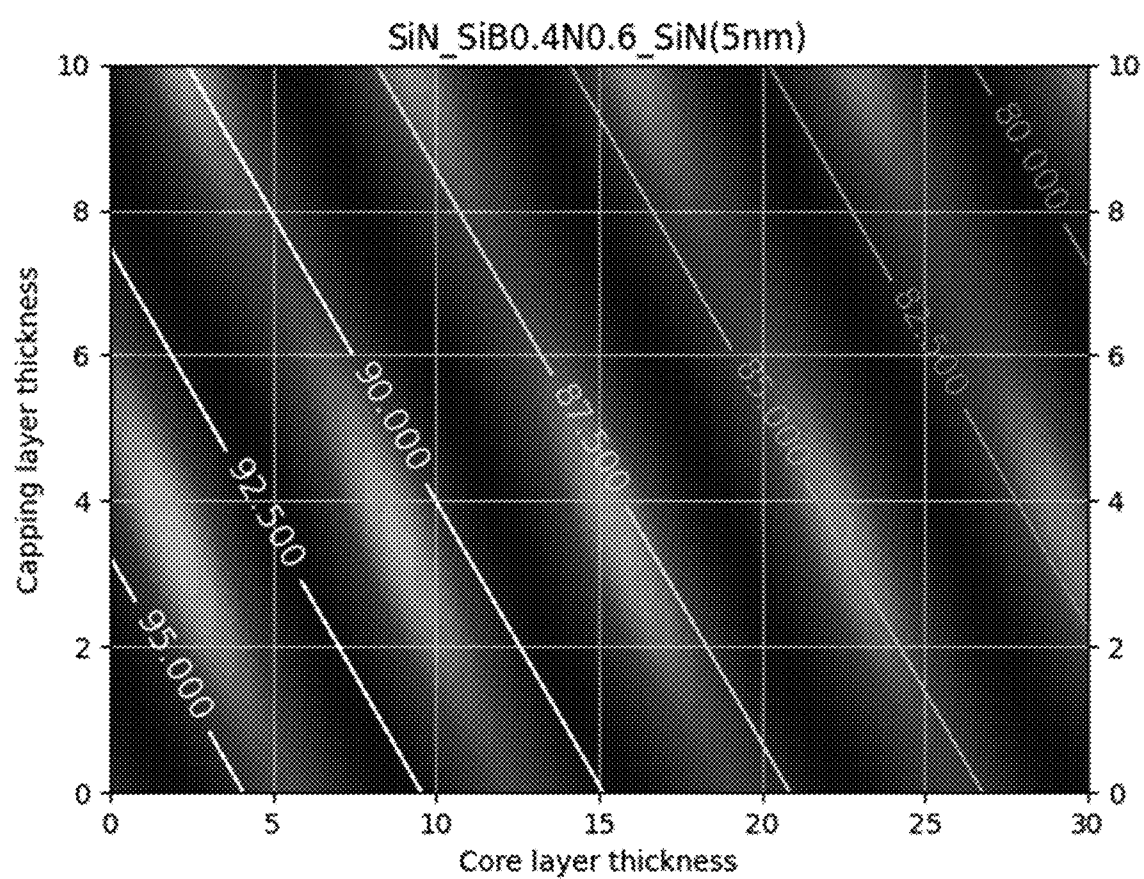

Referring to FIG. 8, the pellicle according to the fourth experimental example was expressed as "SiN_SiB0.4N0.6_SiN(5 nm)".

When the thickness of the core layer is 15 nm or less and the thickness of the capping layer is 10 nm or less, the transmittance is 90% or more.

In addition, when the thickness of the core layer is 30 nm or less and the thickness of the capping layer is 10 nm or less, the reflectance is 0.05% or less.

Figure 9:
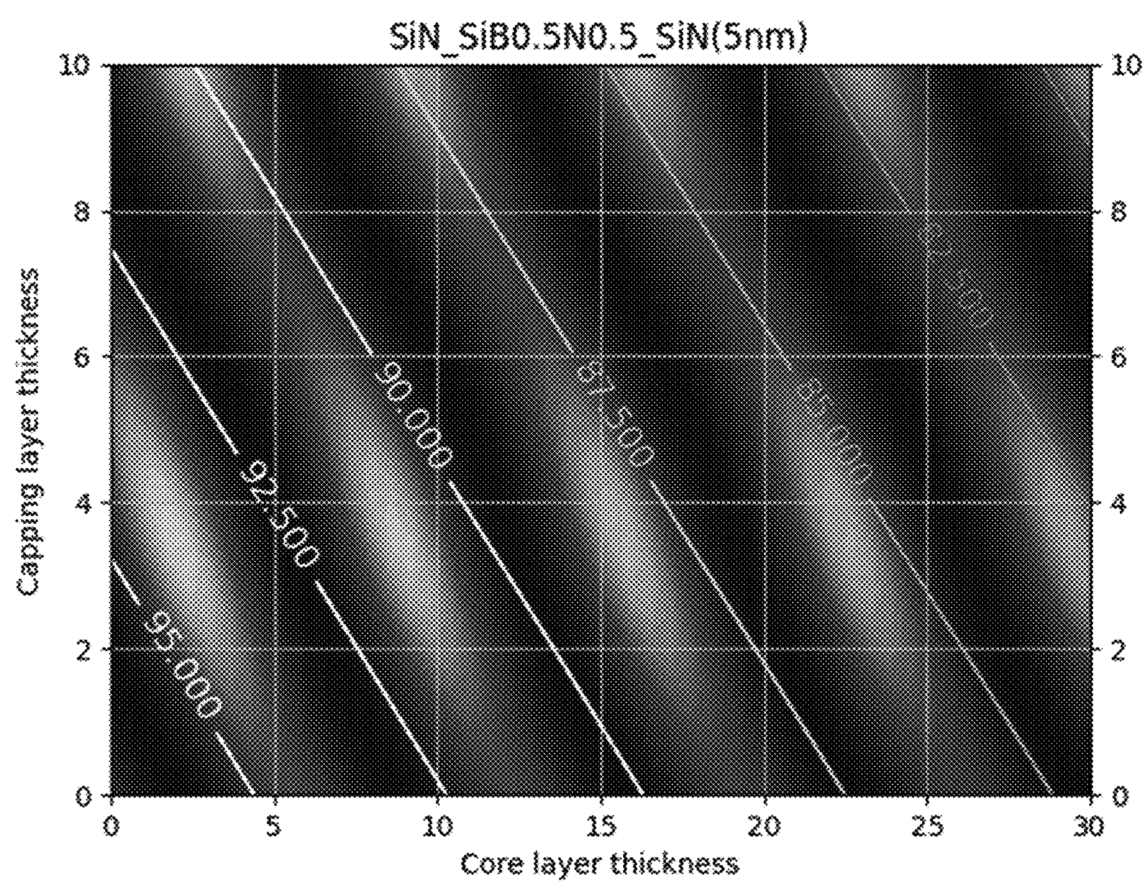

Referring to FIG. 9, the pellicle according to the fifth experimental example was expressed as "SiN_SiB0.5N0.5_SiN(5 nm)".

When the thickness of the core layer is 17 nm or less and the thickness of the capping layer is 10 nm or less, the transmittance is 90% or more.

In addition, when the thickness of the core layer is 30 nm or less and the thickness of the capping layer is 6 to 8 nm, the reflectance is 0.04% or less.

Figure 10:
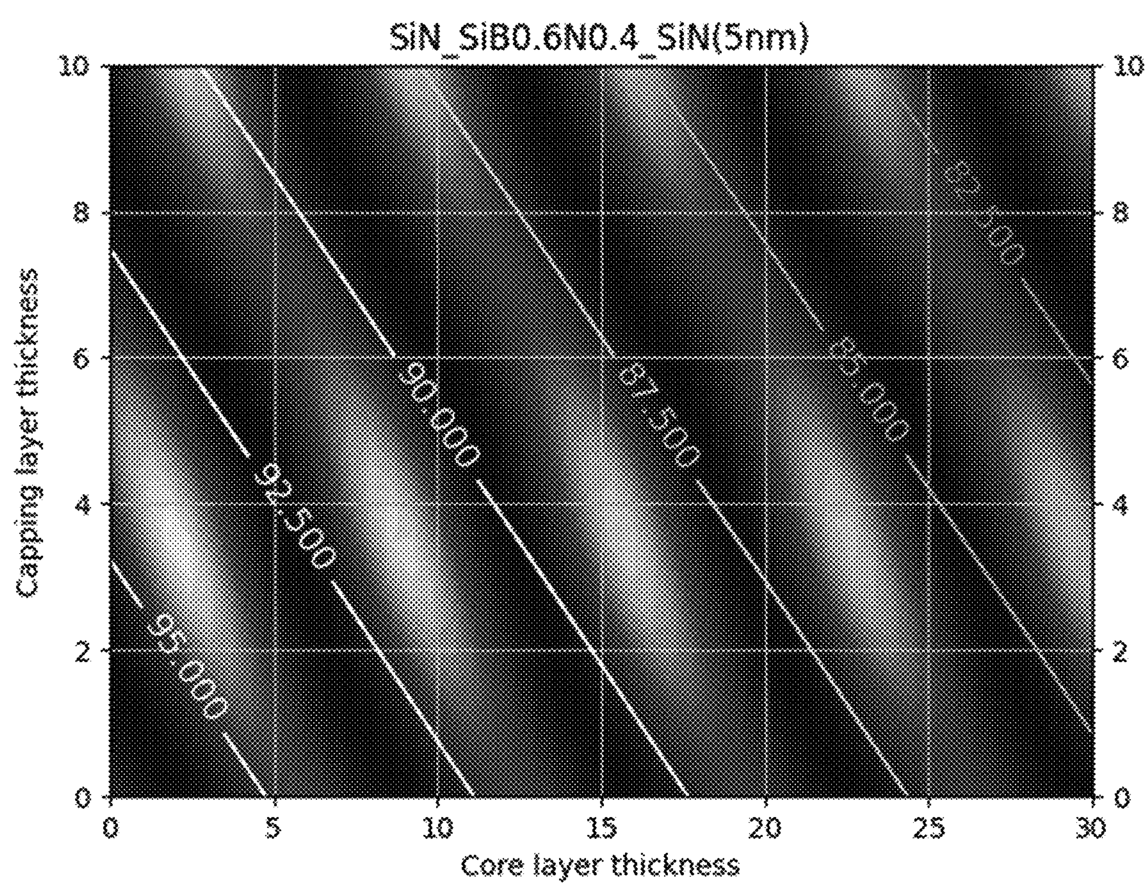

Referring to FIG. 10, the pellicle according to the sixth experimental example was expressed as "SiN_SiB0.6N0.4_SiN(5 nm)".

When the thickness of the core layer is 17 nm or less and the thickness of the capping layer is 10 nm or less, the transmittance is 90% or more.

In addition, when the thickness of the core layer is 30 nm or less and the thickness of the capping layer is 6 to 8 nm, the reflectance is 0.04% or less.

Figure 11:
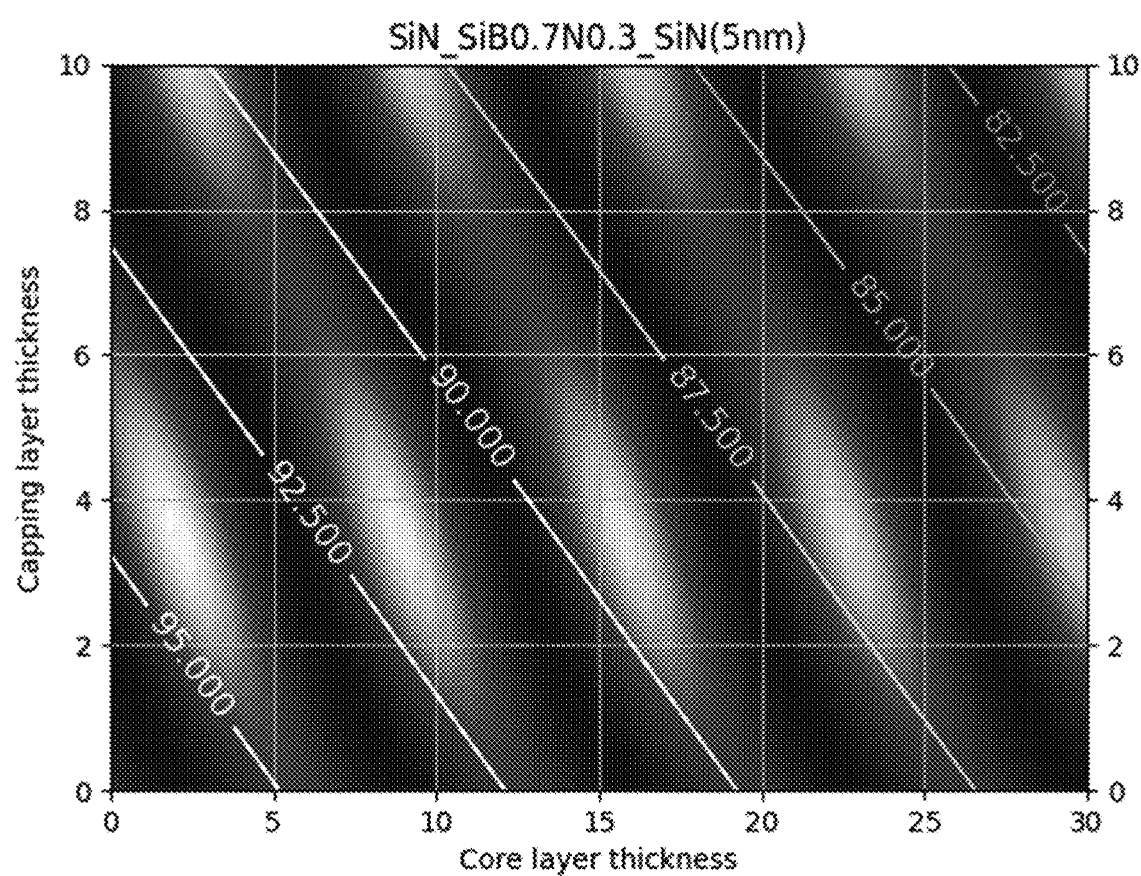

Referring to FIG. 11, the pellicle according to the seventh experimental example was expressed as "SiN_SiB0.7N0.3_SiN(5 nm)".

When the thickness of the core layer is less than 20 nm and the thickness of the capping layer is 10 nm or less, the transmittance is 90% or more.

In addition, when the thickness of the core layer is 30 nm or less and the thickness of the capping layer is 6 to 8 nm, the reflectance is 0.04% or less.

Figure 12:
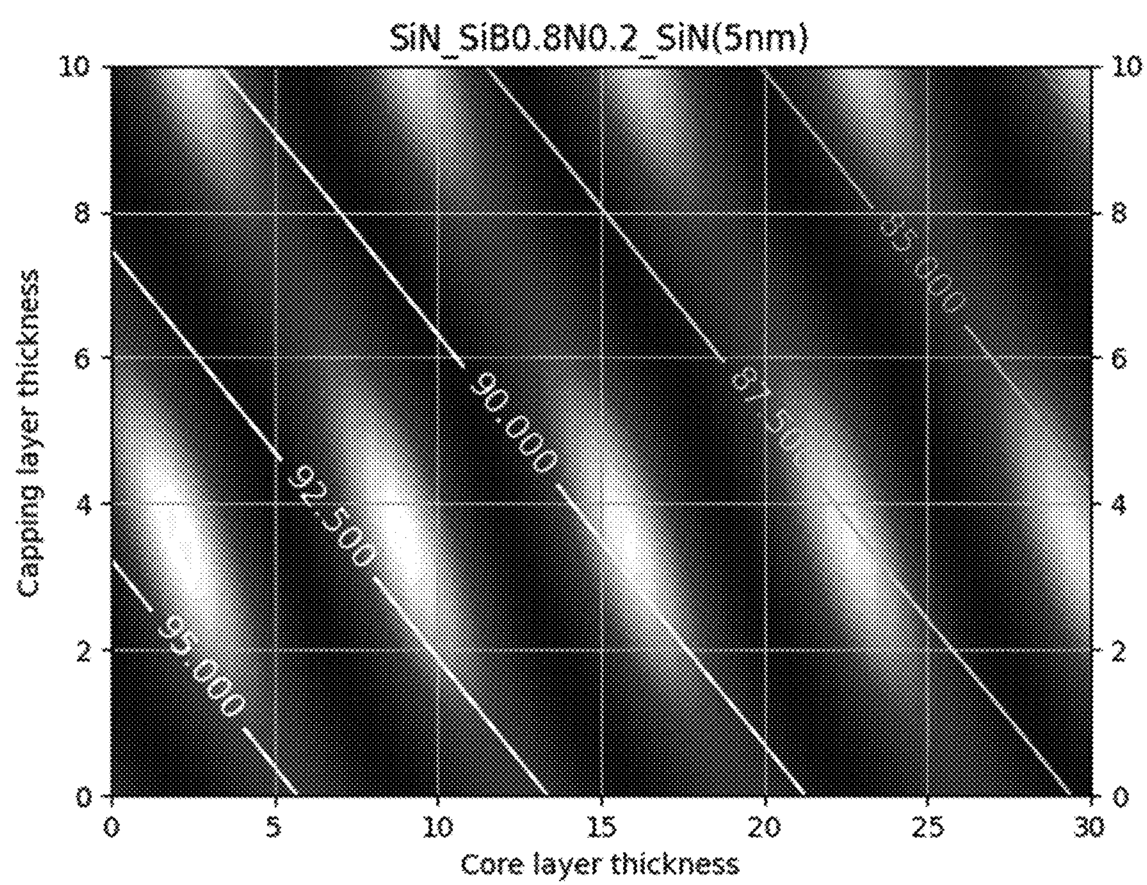

Referring to FIG. 12, the pellicle according to the eighth experimental example was expressed as "SiN_SiB0.8N0.2_SiN(5 nm)".

When the thickness of the core layer is 22 nm or less and the thickness of the capping layer is 10 nm or less, the transmittance is 90% or more.

In addition, when the thickness of the core layer is 30 nm or less and the thickness of the capping layer is 6 to 8 nm, the reflectance is 0.04% or less.

Figure 13:
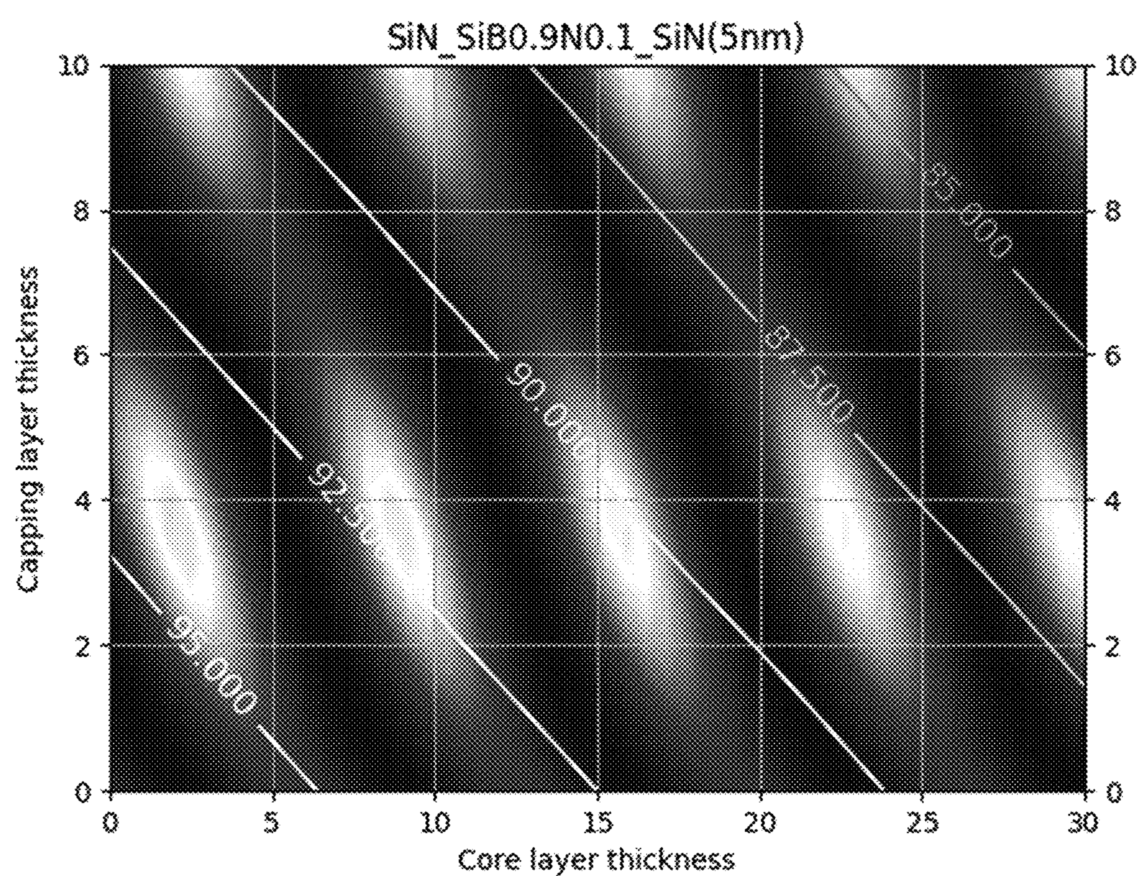

Referring to FIG. 13, the pellicle according to the ninth experimental example was expressed as "SiN_SiB0.9N0.1_SiN(5 nm)".

When the thickness of the core layer is 24 nm or less and the thickness of the capping layer is 10 nm or less, the transmittance is 90% or more.

In addition, when the thickness of the core layer is 30 nm or less and the thickness of the capping layer is 6 to 8 nm, the reflectance is 0.04% or less.

As such, according to the first to ninth experimental examples, in case of using $SiB_xN_{1-x}$ (0<x<1) as the material of the core layer, it can be seen that the pellicle having an extreme ultraviolet transmittance of 90% or more and having a reflectance of 0.04% or less is provided when the thickness of the core layer is 24 nm or less and the thickness of the capping layer is 6 to 8 nm.

Tenth to Eighteenth Experimental Examples

FIGS. 14 to 22 are graphs showing transmittance and reflectance of a pellicle for extreme ultraviolet lithography according to tenth to eighteenth experimental examples of the present disclosure.

In the pellicle layers according to the tenth to eighteenth experimental examples, Si was used as M, and B and N were used as $\alpha$. Here, the material of the support layer is $SiN_x$. The material of the core layer is $SiB_{6x}N_{1-x}$ (0<x<1). The material of the capping layer is $SiN_x$.

The pellicles according to the tenth to eighteenth experimental examples were expressed as "SiN_SiBaNb_SiN(5 nm)". Here, 'SiN(5 nm)' denotes the support layer. Also, 'SiBaNb' denotes the core layer. And, 'SiN' denotes the capping layer.

Figure 14:
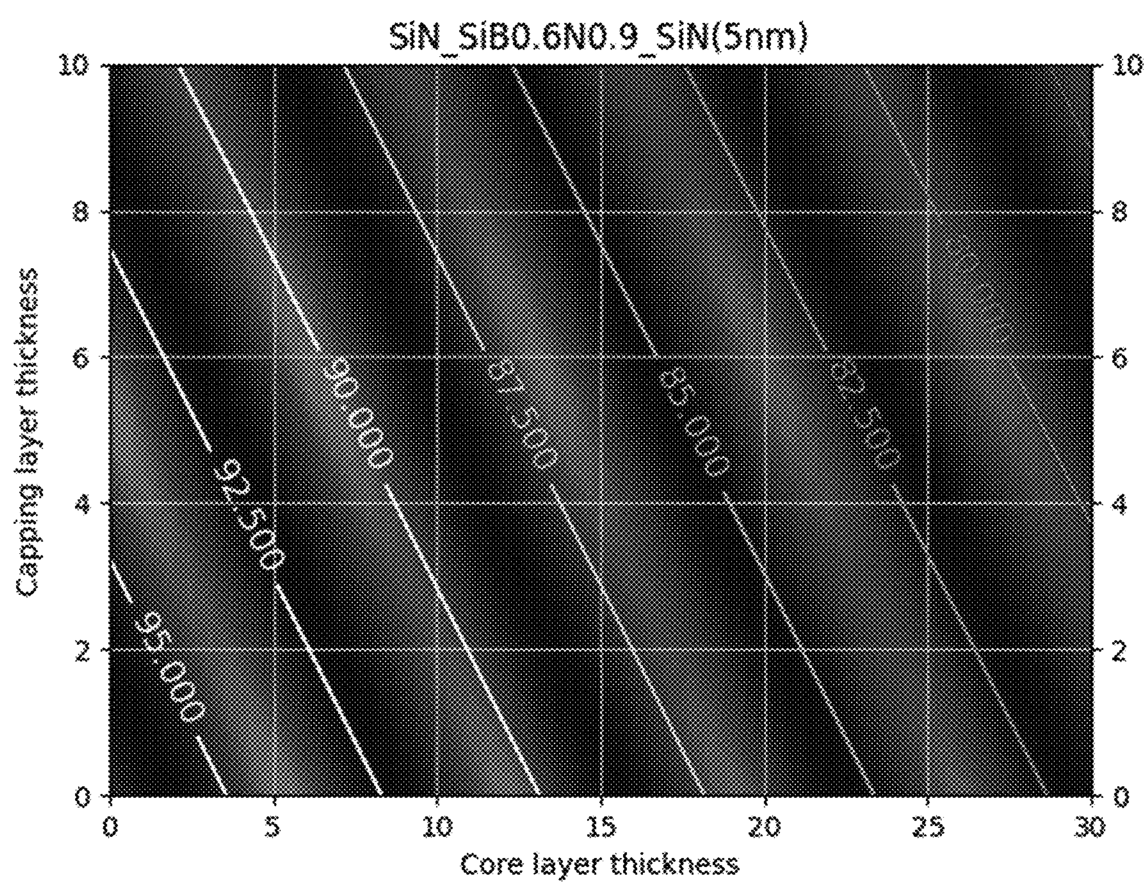
FIGS. 14 to 22 are graphs showing transmittance and reflectance of a pellicle for extreme ultraviolet lithography according to tenth to eighteenth experimental examples of the present disclosure.

Referring to FIG. 14, the pellicle according to the tenth experimental example was expressed as "SiN_SiB0.6N0.9_SiN(5 nm)".

When the thickness of the core layer is 13 nm or less and the thickness of the capping layer is 10 nm or less, the transmittance is 90% or more.

In addition, when the thickness of the core layer is 30 nm or less and the thickness of the capping layer is 10 nm or less, the reflectance is 0.05% or less.

Figure 15:
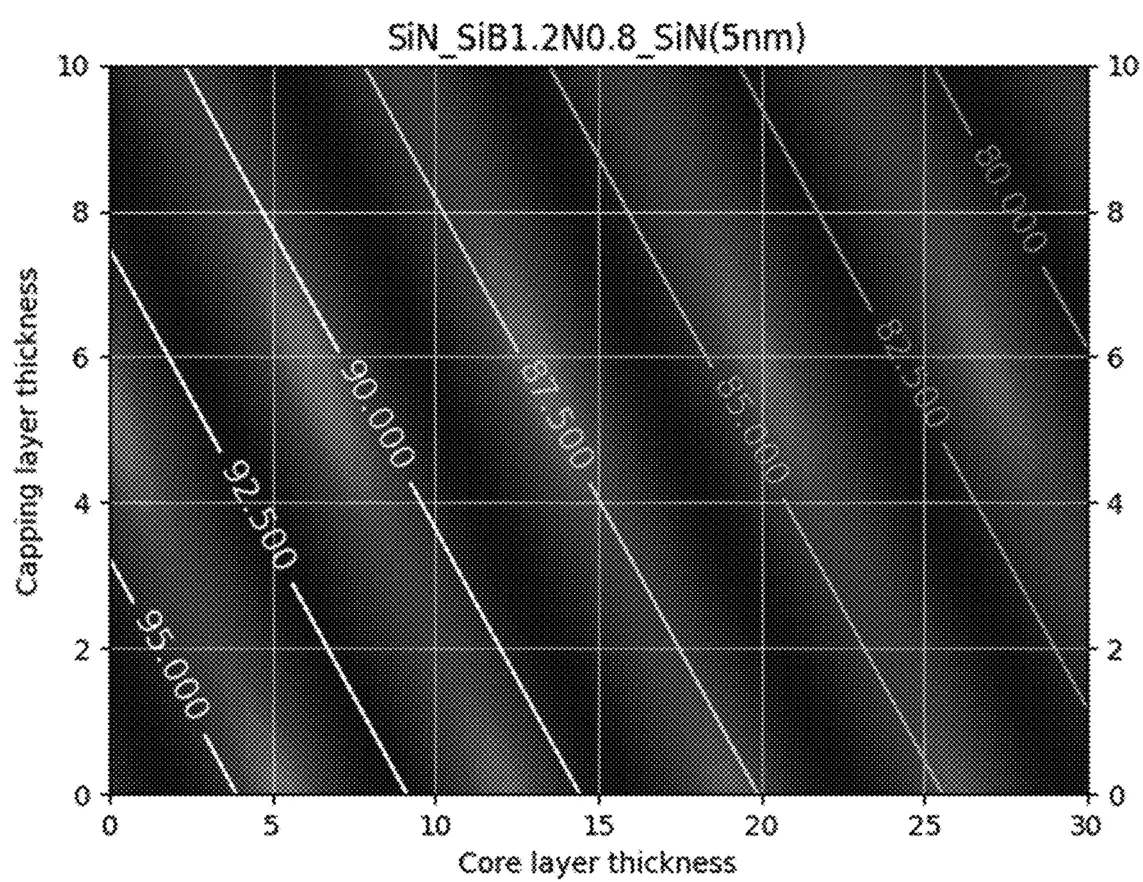

Referring to FIG. 15, the pellicle according to the eleventh experimental example was expressed as "SiN_SiB1.2N0.8_SiN(5 nm)".

When the thickness of the core layer is less than 15 nm and the thickness of the capping layer is 10 nm or less, the transmittance is 90% or more.

In addition, when the thickness of the core layer is 30 nm or less and the thickness of the capping layer is 10 nm or less, the reflectance is 0.05% or less.

Figure 16:
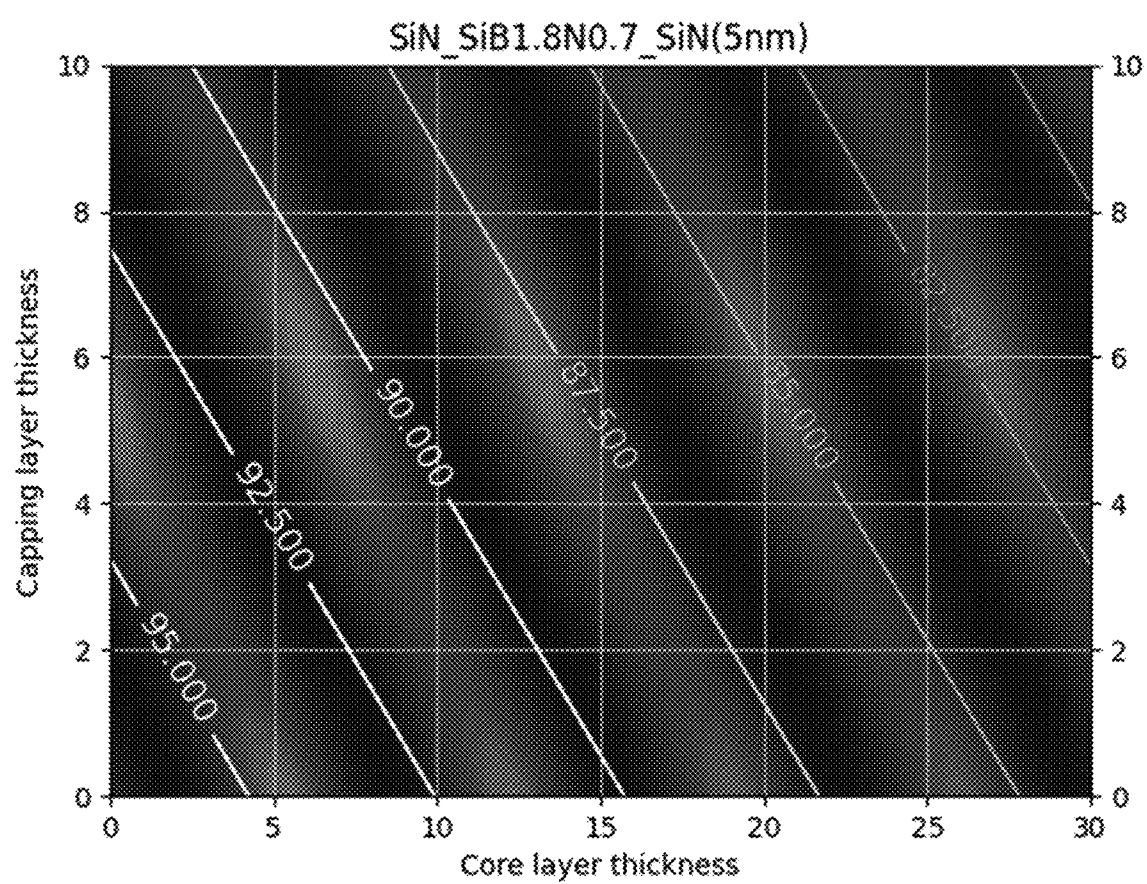

Referring to FIG. 16, the pellicle according to the twelfth experimental example was expressed as "SiN_SiB1.8N0.7_SiN(5 nm)".

When the thickness of the core layer is 16 nm or less and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 17:
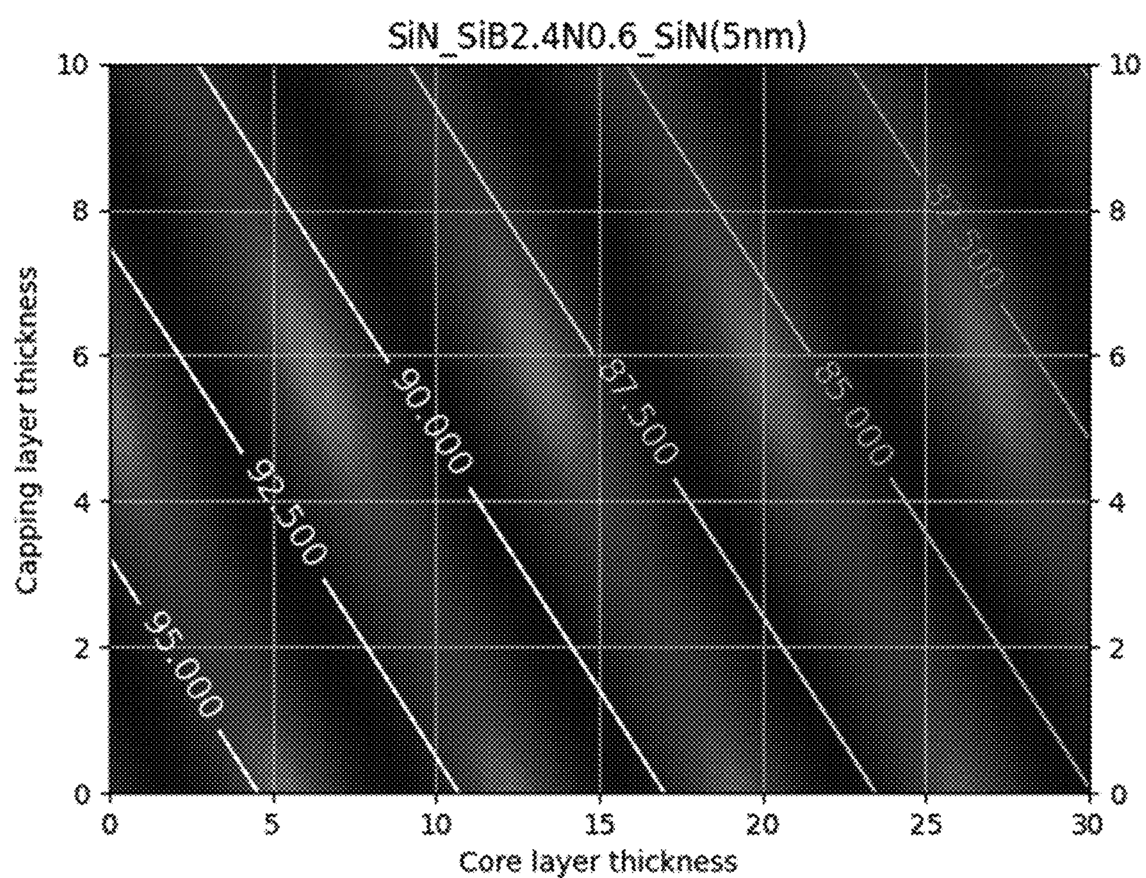

Referring to FIG. 17, the pellicle according to the thirteenth experimental example was expressed as "SiN_SiB2.4N0.6_SiN(5 nm)".

When the thickness of the core layer is 17 nm or less and the thickness of the capping layer is 10 nm or less, the transmittance is 90% or more.

In addition, when the thickness of the core layer is 30 nm or less and the thickness of the capping layer is 1 to 4 nm or 8 to 10 nm, the reflectance is 0.04% or less.

Figure 18:
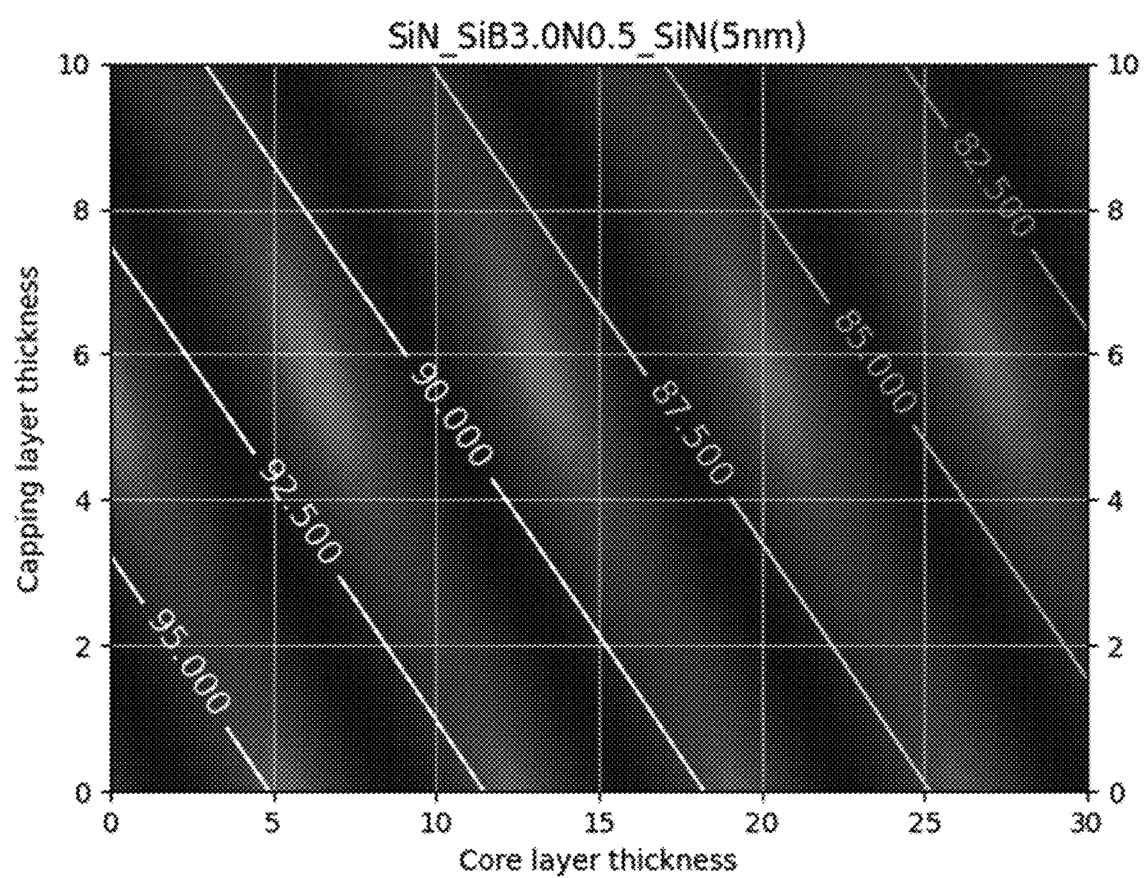

Referring to FIG. 18, the pellicle according to the fourteenth experimental example was expressed as "SiN_SiB3.0N0.5_SiN(5 nm)".

When the thickness of the core layer is 18 nm or less and the thickness of the capping layer is 10 nm or less, the transmittance is 90% or more.

In addition, when the thickness of the core layer is 30 nm or less and the thickness of the capping layer is 1 to 4 nm or 7 to 10 nm, the reflectance is 0.04% or less.

Figure 19:
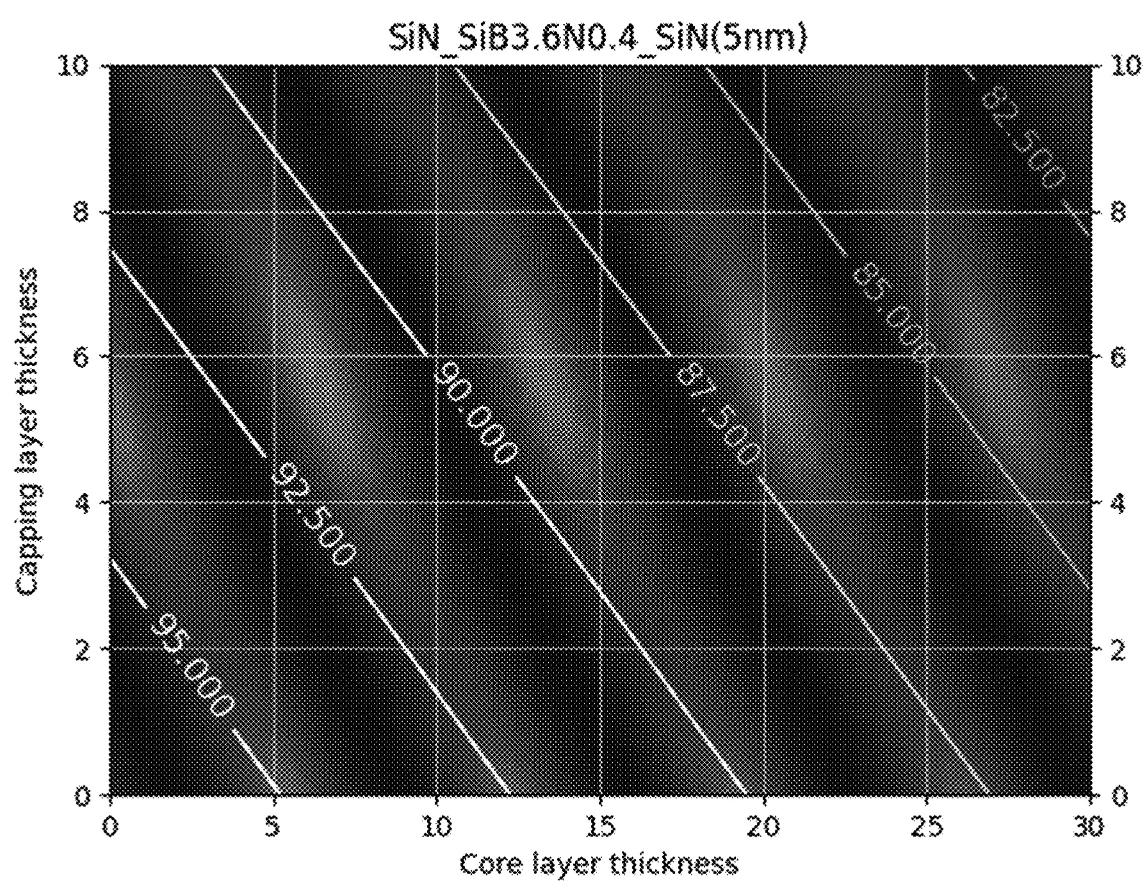

Referring to FIG. 19, the pellicle according to the fifteenth experimental example was expressed as "SiN_SiB3.6N0.4_SiN(5 nm)".

When the thickness of the core layer is less than 20 nm and the thickness of the capping layer is 10 nm or less, the transmittance is 90% or more.

In addition, when the thickness of the core layer is 30 nm or less and the thickness of the capping layer is 1 to 4 nm or 8 to 10 nm, the reflectance is 0.04% or less.

Figure 20:
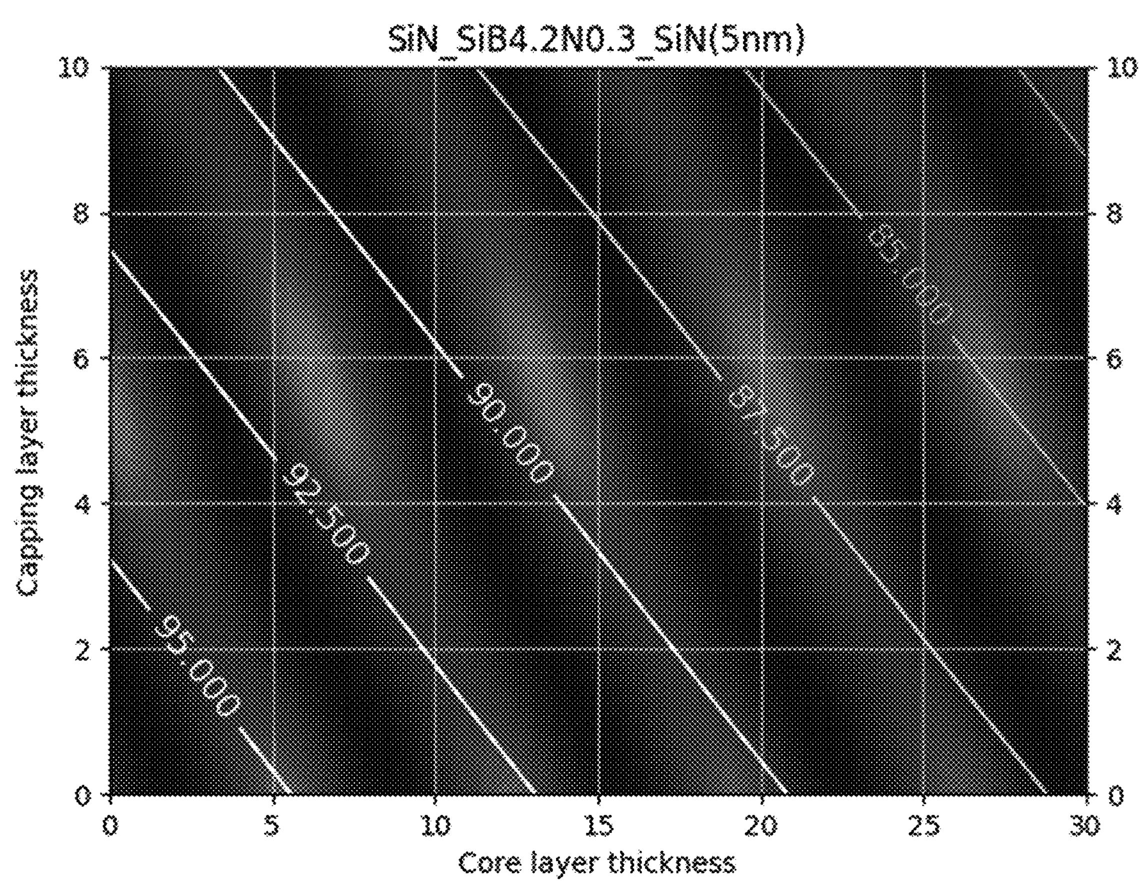

Referring to FIG. 20, the pellicle according to the sixteenth experimental example was expressed as "SiN_SiB4.2N0.3_SiN(5 nm)".

When the thickness of the core layer is less than 22 nm and the thickness of the capping layer is 10 nm or less, the transmittance is 90% or more.

In addition, when the thickness of the core layer is 30 nm or less and the thickness of the capping layer is 1 to 4 nm or 7 to 10 nm, the reflectance is 0.04% or less.

Figure 21:
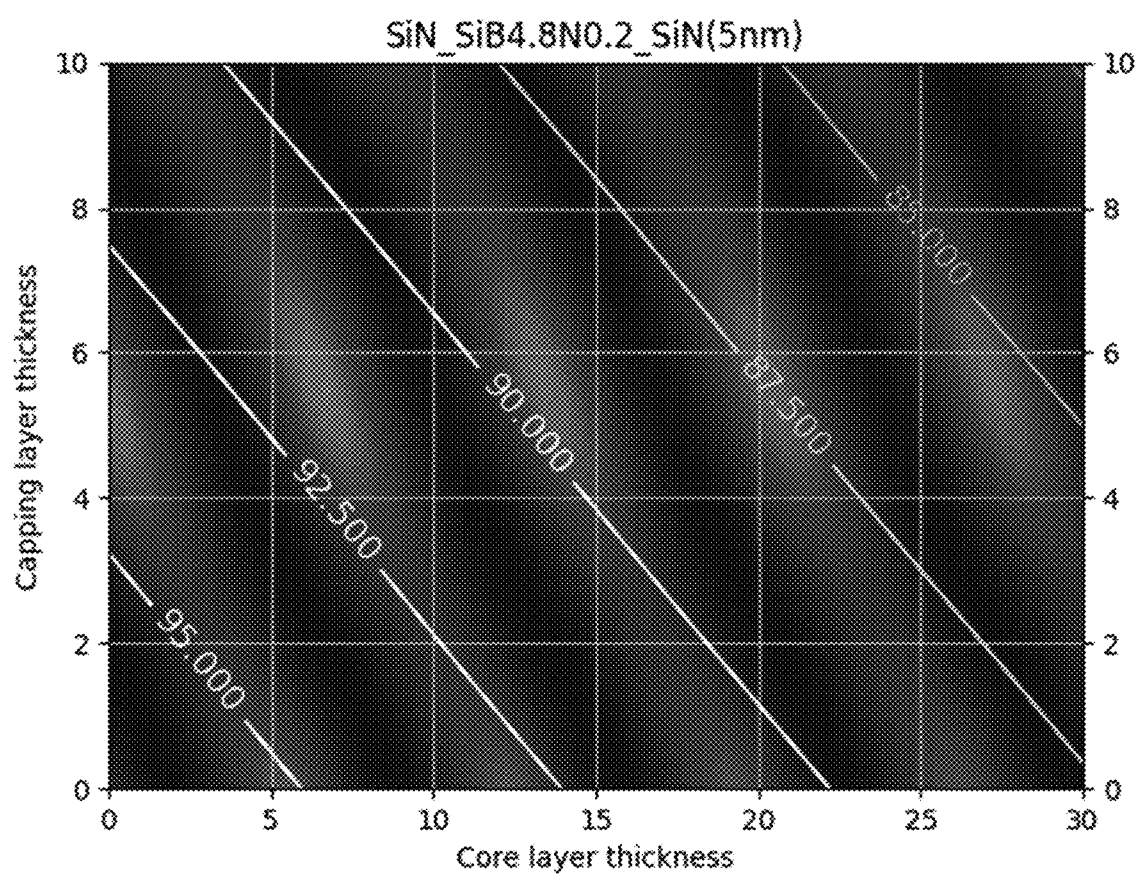

Referring to FIG. 21, the pellicle according to the seventeenth experimental example was expressed as "SiN_SiB4.8N0.2_SiN(5 nm)".

When the thickness of the core layer is 23 nm or less and the thickness of the capping layer is 10 nm or less, the transmittance is 90% or more.

In addition, when the thickness of the core layer is 30 nm or less and the thickness of the capping layer is 1 to 4 nm or 7 to 10 nm, the reflectance is 0.04% or less.

Figure 22:
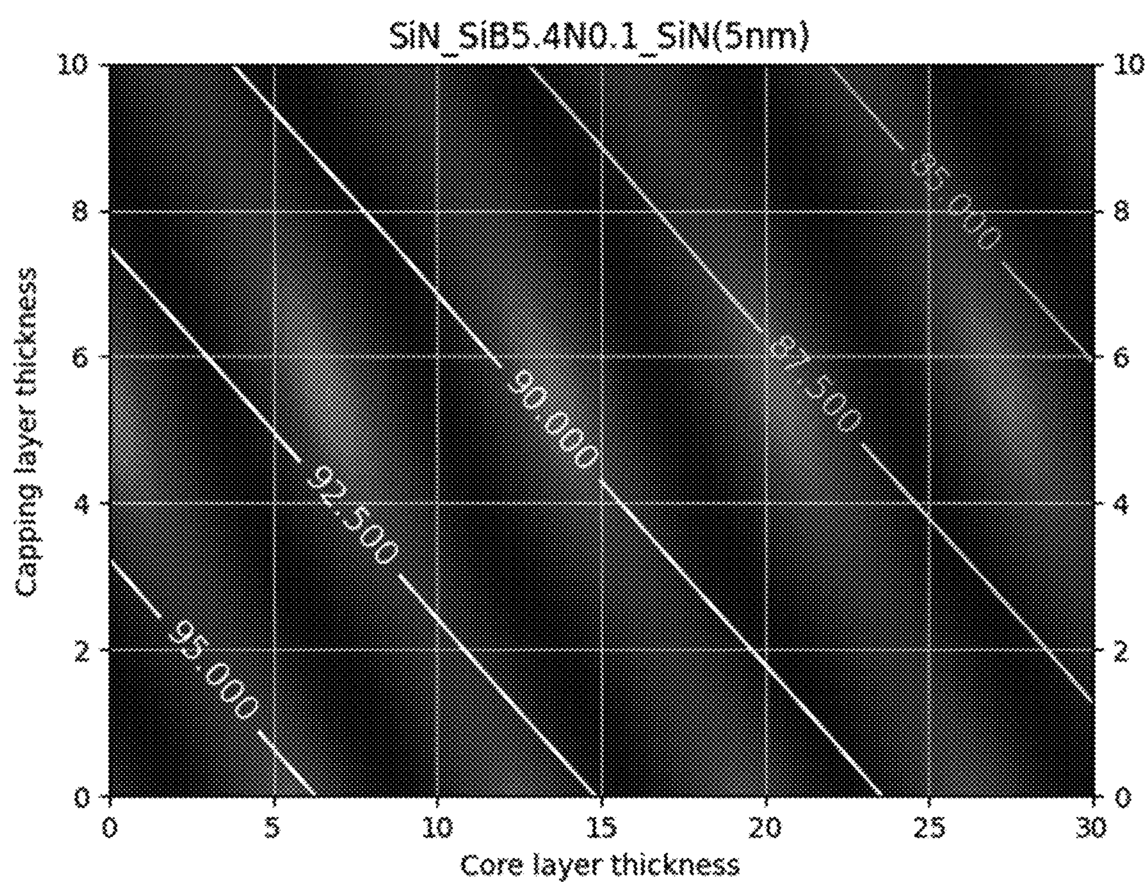

Referring to FIG. 22, the pellicle according to the eighteenth experimental example was expressed as "SiN_SiB5.4N0.1_SiN(5 nm)".

When the thickness of the core layer is 24 nm or less and the thickness of the capping layer is 10 nm or less, the transmittance is 90% or more.

In addition, when the thickness of the core layer is 30 nm or less and the thickness of the capping layer is 1 to 4 nm or 7 to 10 nm, the reflectance is 0.04% or less.

As such, according to the tenth to eighteenth experimental examples, in case of using $SiB_{6x}N_{1-x}$ (0<x<1) as the material of the core layer, it can be seen that the pellicle having an extreme ultraviolet transmittance of 90% or more and having a reflectance of 0.04% or less is provided when the thickness of the core layer is 24 nm or less and the thickness of the capping layer is 1 to 4 nm or 7 to 10 nm.

Nineteenth to Twenty-Seventh Experimental Examples

FIGS. 23 to 31 are graphs showing transmittance and reflectance of a pellicle for extreme ultraviolet lithography according to nineteenth to twenty-seventh experimental examples of the present disclosure.

In the pellicle layers according to the nineteenth to twenty-seventh experimental examples, Y was used as M, and B and N were used as α. Here, the material of the support layer is $SiN_x$. The material of the core layer is $YB_{2x}N_{1-x}$ (0<x<1). The material of the capping layer is $SiN_x$.

The pellicles according to the nineteenth to twenty-seventh experimental examples were expressed as "SiN_YBaNb_SiN(5 nm)". Here, 'SiN(5 nm)' denotes the support layer. Also, 'YBaNb' denotes the core layer. And, 'SiN' denotes the capping layer.

Figure 23:
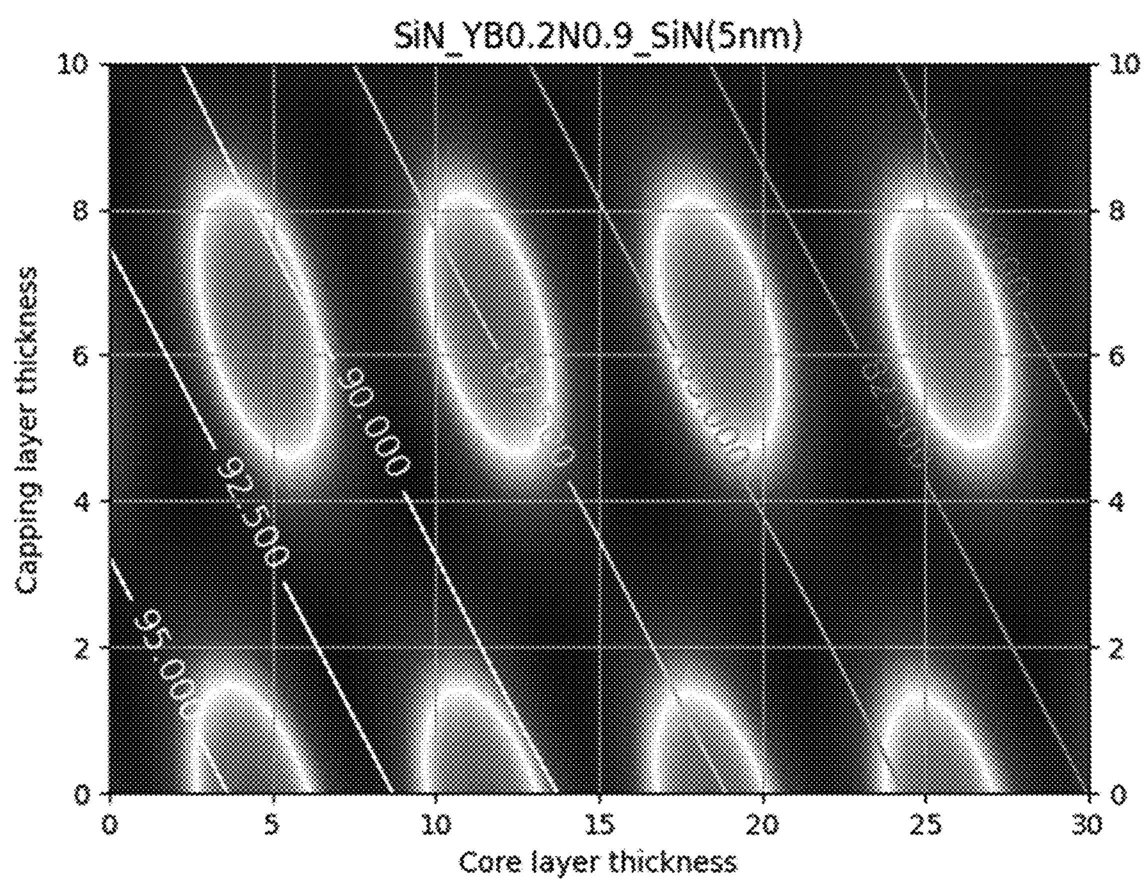
FIGS. 23 to 31 are graphs showing transmittance and reflectance of a pellicle for extreme ultraviolet lithography according to nineteenth to twenty-seventh experimental examples of the present disclosure.

Referring to FIG. 23, the pellicle according to the nineteenth experimental example was expressed as "SiN_YB0.2N0.9_SiN(5 nm)".

When the thickness of the core layer is 14 nm or less and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 24:
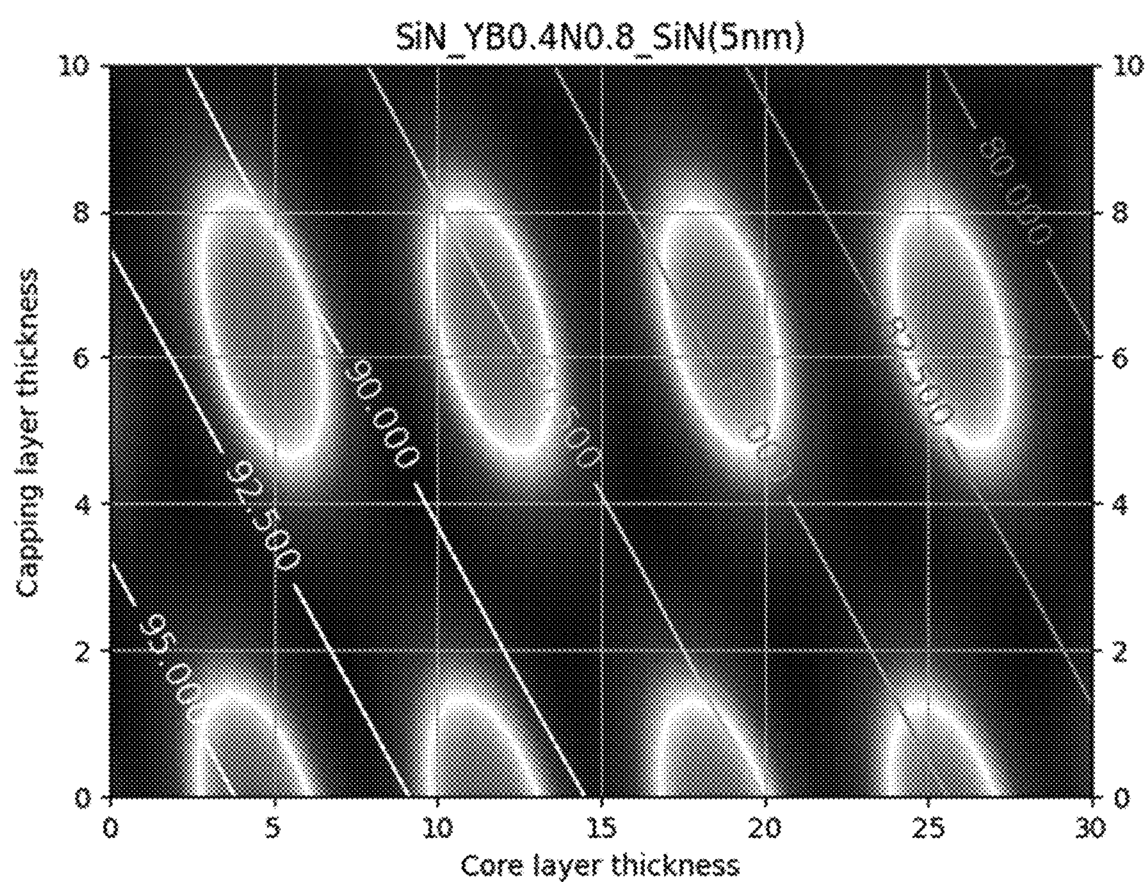

Referring to FIG. 24, the pellicle according to the twentieth experimental example was expressed as "SiN_YB0.4N0.8_SiN(5 nm)".

When the thickness of the core layer is less than 15 nm and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 25:
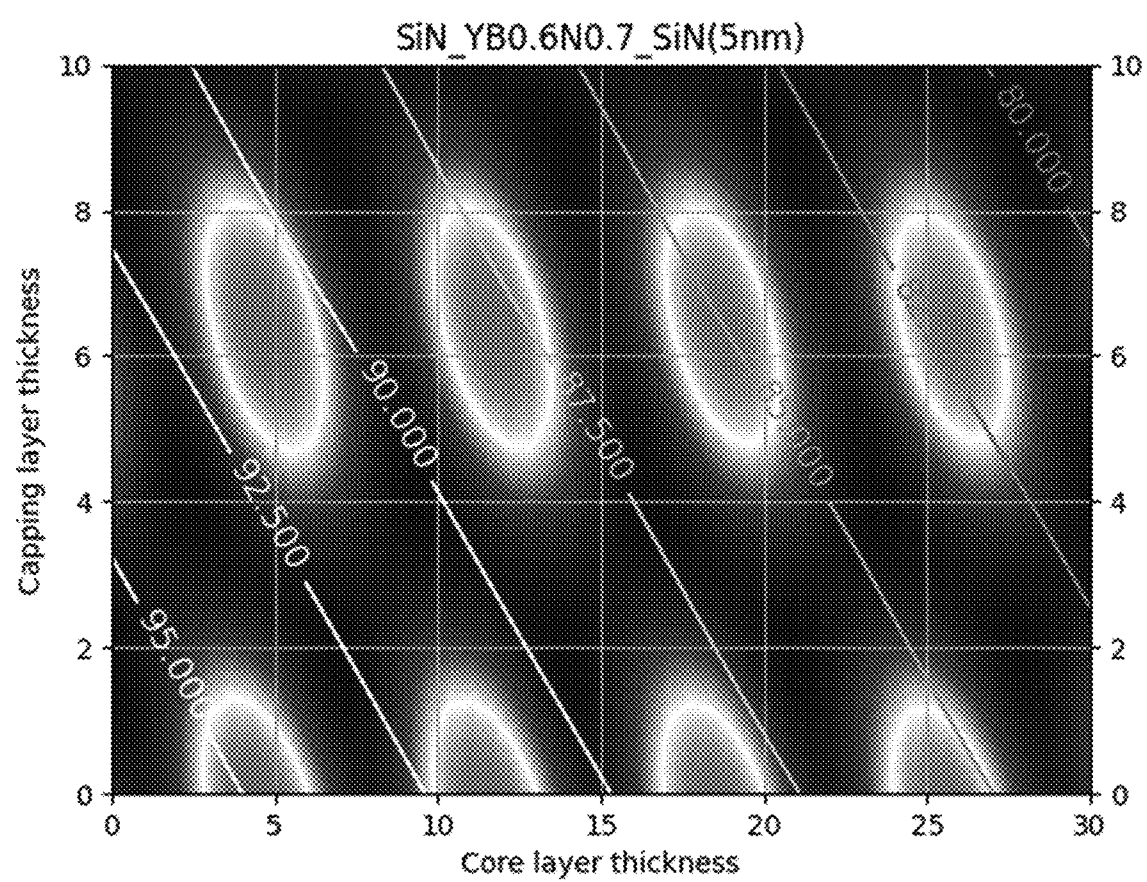

Referring to FIG. 25, the pellicle according to the twenty-first experimental example was expressed as "SiN_YB0.6N0.7_SiN(5 nm)".

When the thickness of the core layer is less than 16 nm and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 26:
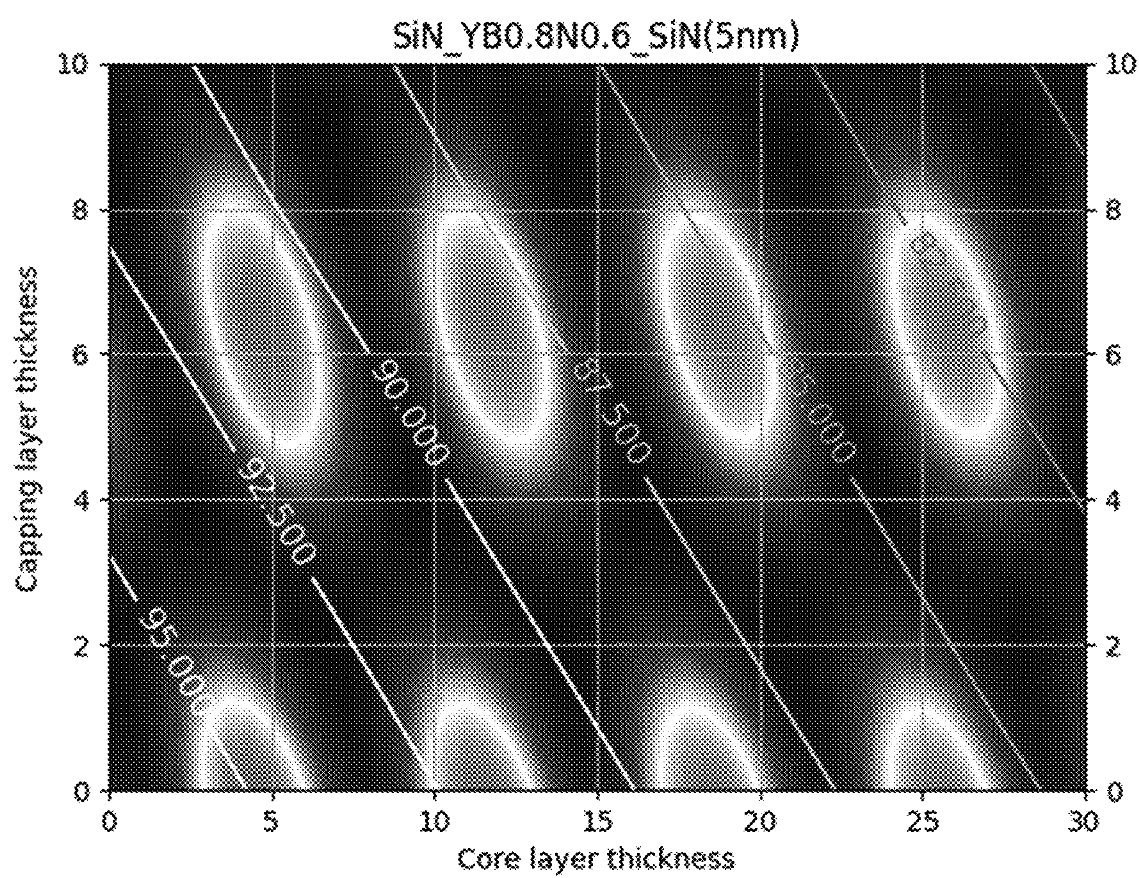

Referring to FIG. 26, the pellicle according to the twenty-second experimental example was expressed as "SiN_YB0.8N0.6_SiN(5 nm)".

When the thickness of the core layer is less than 17 nm and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 27:
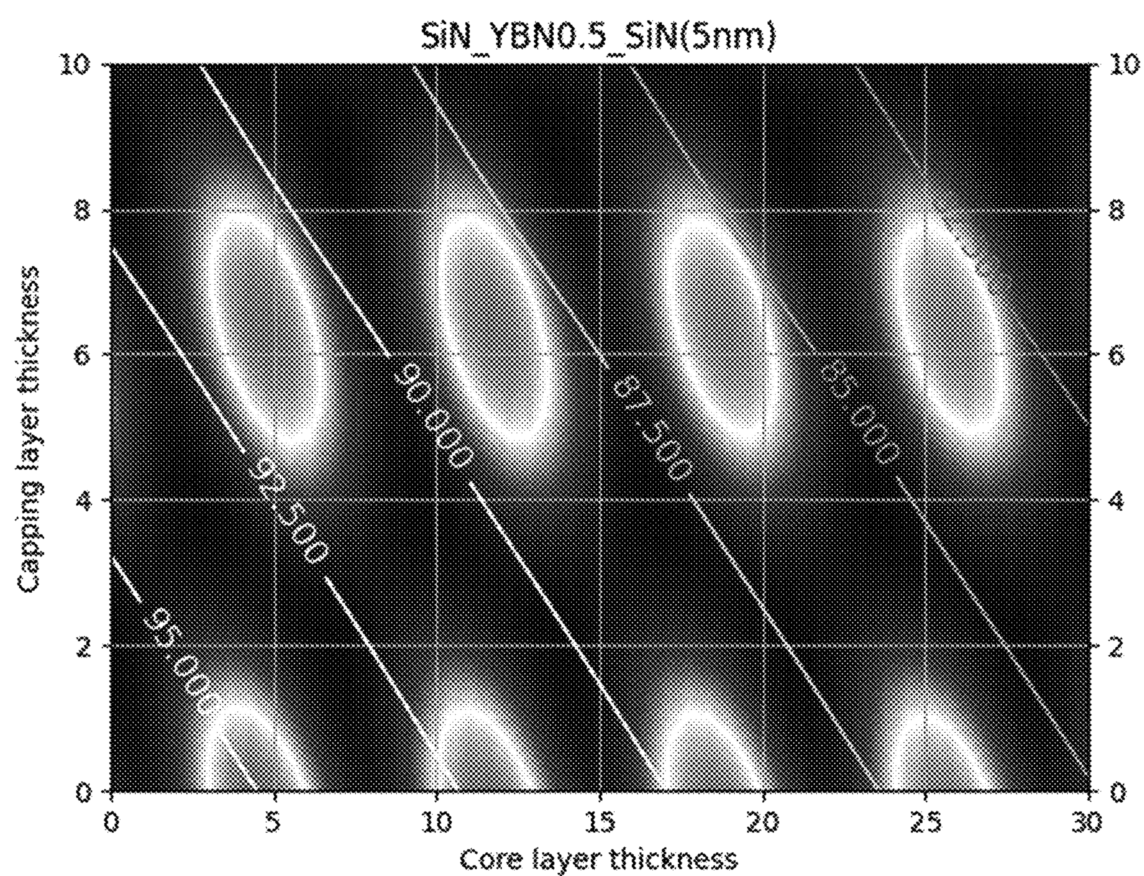

Referring to FIG. 27, the pellicle according to the twenty-third experimental example was expressed as "SiN_YB1.0N0.5_SiN(5 nm)".

When the thickness of the core layer is 17 nm or less and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 28:
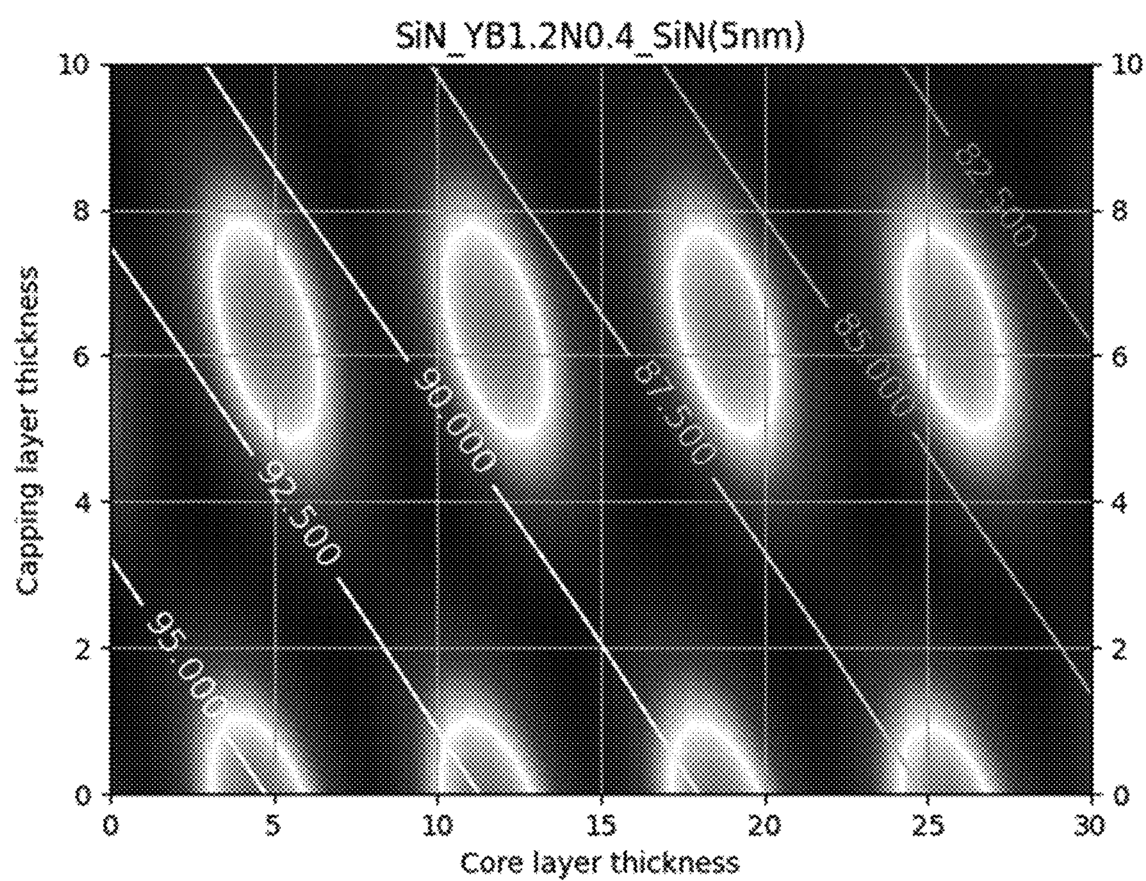

Referring to FIG. 28, the pellicle according to the twenty-fourth experimental example was expressed as "SiN_YB1.2N0.4_SiN(5 nm)".

When the thickness of the core layer is less than 18 nm and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 29:
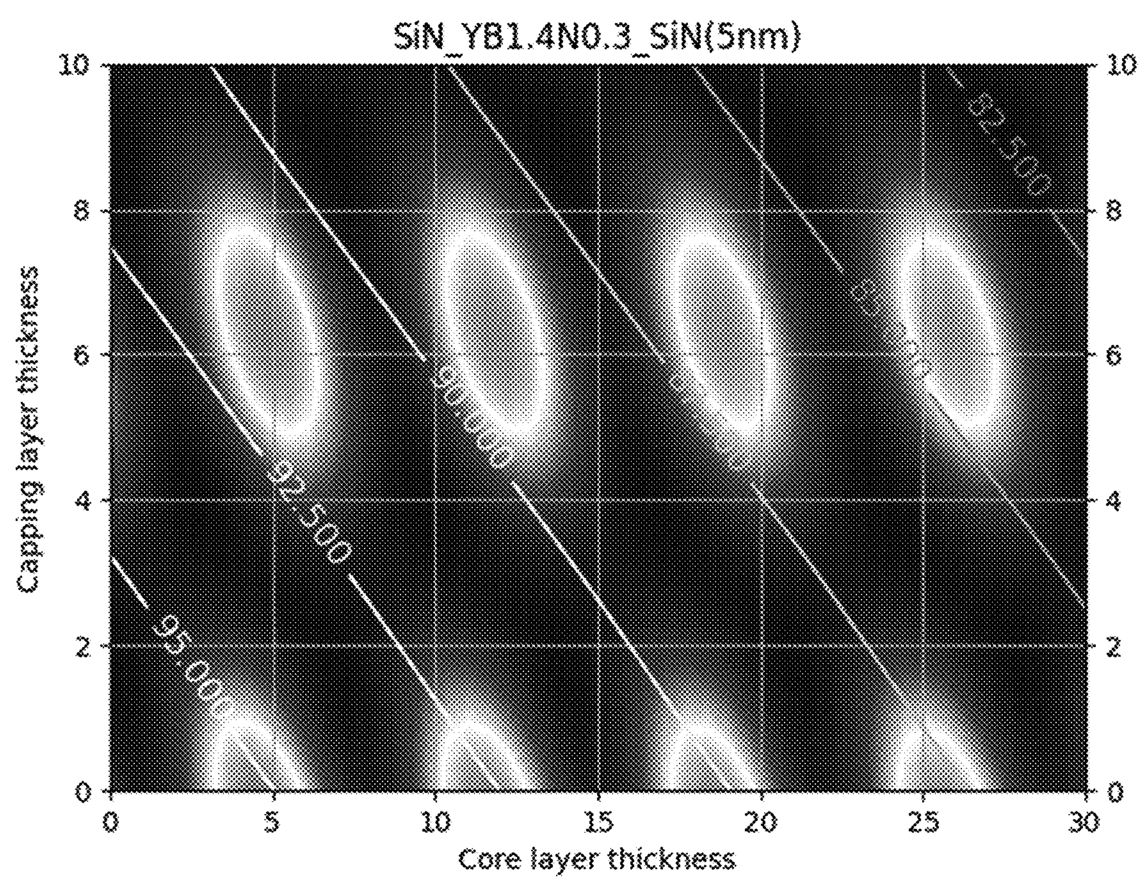

Referring to FIG. 29, the pellicle according to the twenty-fifth experimental example was expressed as "SiN_YB1.4N0.3_SiN(5 nm)".

When the thickness of the core layer is less than 19 nm and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 30:
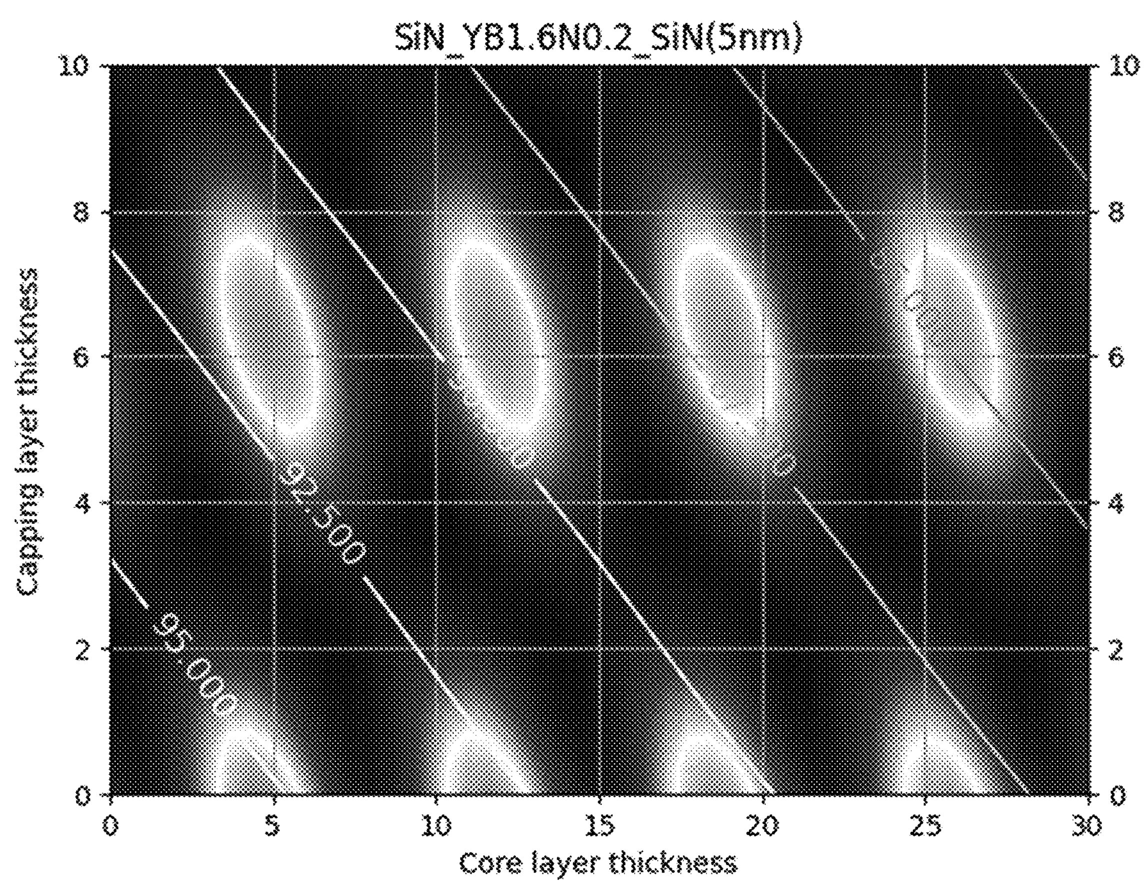

Referring to FIG. 30, the pellicle according to the twenty-sixth experimental example was expressed as "SiN_YB1.6N0.2_SiN(5 nm)".

When the thickness of the core layer is less than 21 nm and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

Figure 31:
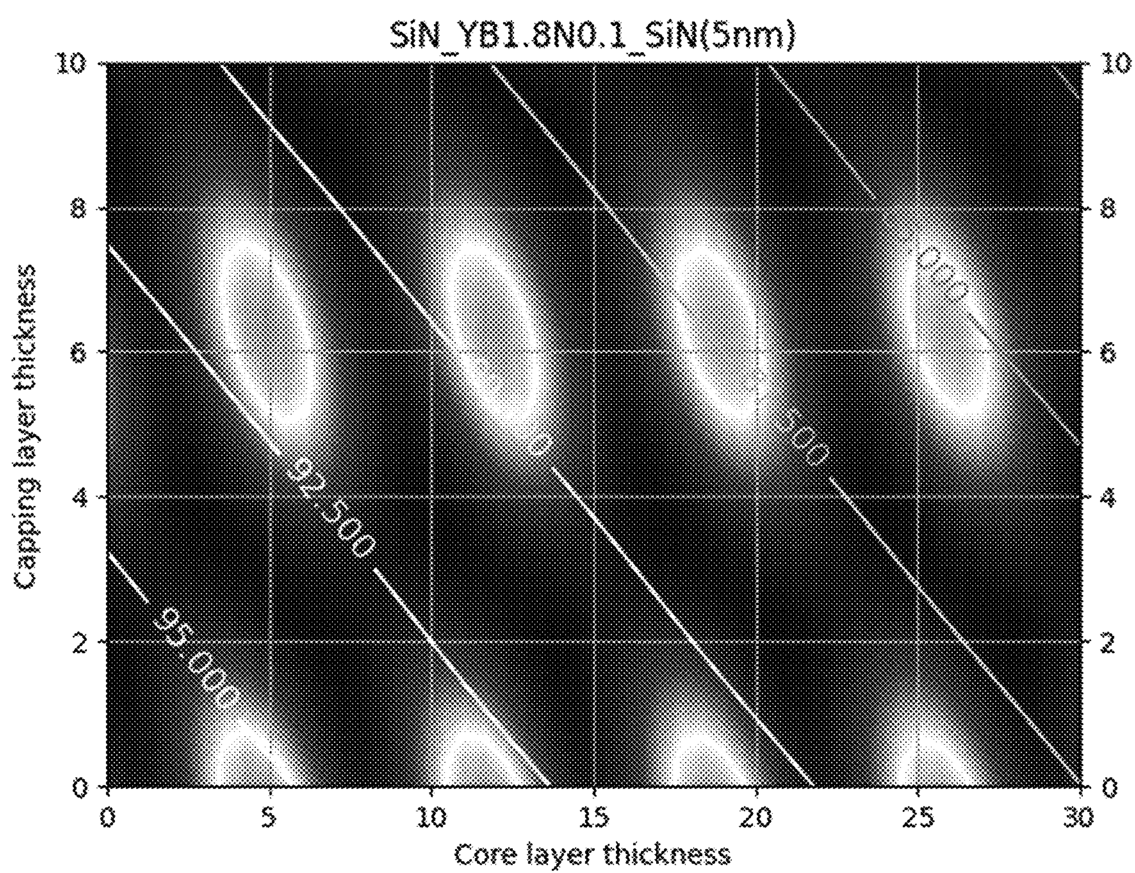

Referring to FIG. 31, the pellicle according to the twenty-seventh experimental example was expressed as "SiN_YB1.8N0.1_SiN(5 nm)".

When the thickness of the core layer is less than 23 nm and the thickness of the capping layer is 10 nm or less, the transmittance is 90% or more.

In addition, when the thickness of the core layer is 30 nm or less and the thickness of the capping layer is 2 to 4 nm or 8 to 10 nm, the reflectance is 0.04% or less.

As such, according to the nineteenth to twenty-seventh experimental examples, in case of using $YB_{2x}N_{1-x}$ (0<x<1) as the material of the core layer and using $SiN_x$ as the materials of the support layer and the capping layer, it can be seen that the pellicle having an extreme ultraviolet transmittance of 90% or more and having a reflectance of 0.04% or less is provided when the thickness of the core layer is less than 23 nm and the thickness of the capping layer is 2 to 4 nm or 8 to 10 nm.

Twenty-Eighth to Thirty-Sixth Experimental Examples

FIGS. 32 to 40 are graphs showing transmittance and reflectance of a pellicle for extreme ultraviolet lithography according to twenty-eighth to thirty-sixth experimental examples of the present disclosure.

In the pellicle layers according to the twenty-eighth to thirty-sixth experimental examples, Y was used as M, and B and N were used as α. Here, the material of the support layer is $YB_6$. The material of the core layer is $YB_{2x}N_{1-x}$ (0<x<1). The material of the capping layer is $YB_6$.

The pellicles according to the twenty-eighth to thirty-sixth experimental examples were expressed as "YB6_YBaNb_YB6(5 nm)". Here, 'YB6(5 nm)' denotes the support layer. Also, 'YBaNb' denotes the core layer. And, 'YB6' denotes the capping layer.

Figure 32:
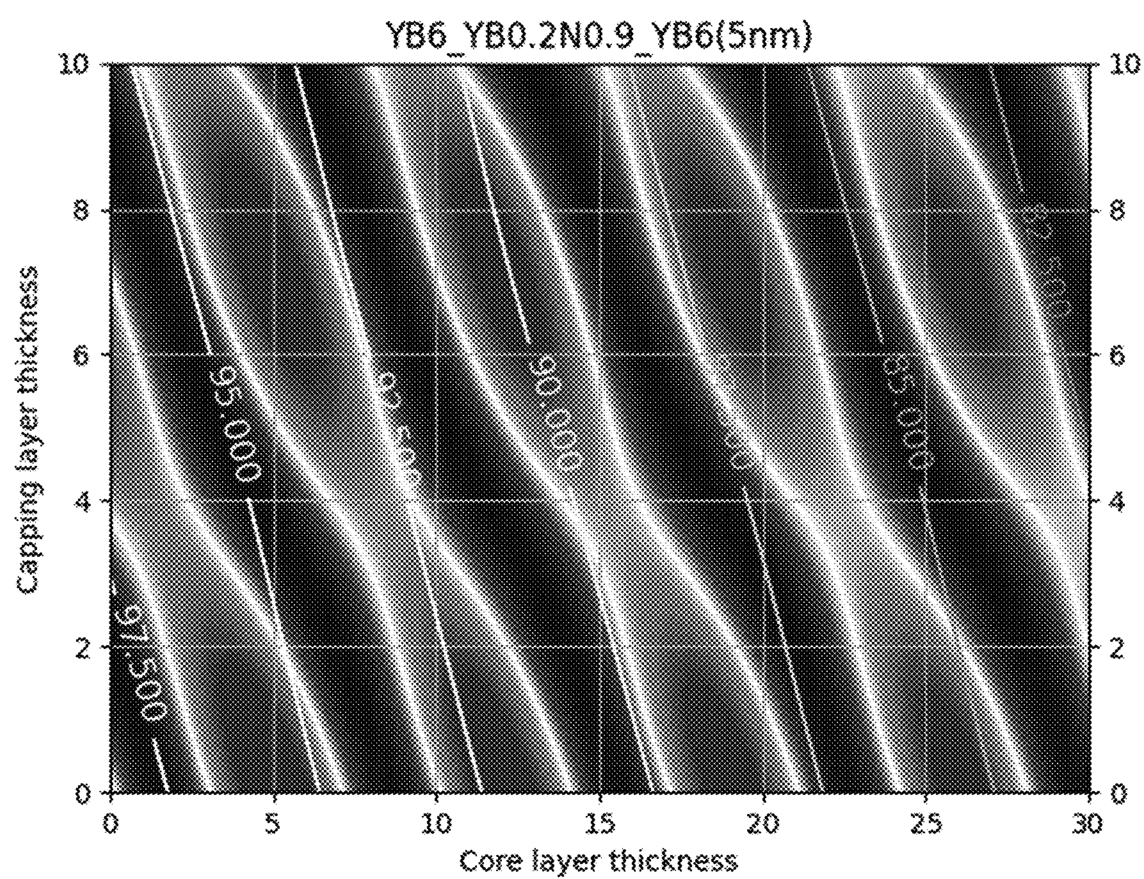
FIGS. 32 to 40 are graphs showing transmittance and reflectance of a pellicle for extreme ultraviolet lithography according to twenty-eighth to thirty-sixth experimental examples of the present disclosure.

Referring to FIG. 32, the pellicle according to the twenty-eighth experimental example was expressed as "YB6_YB0.2N0.9_YB6(5 nm)".

When the thickness of the core layer is less than 18 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 33:
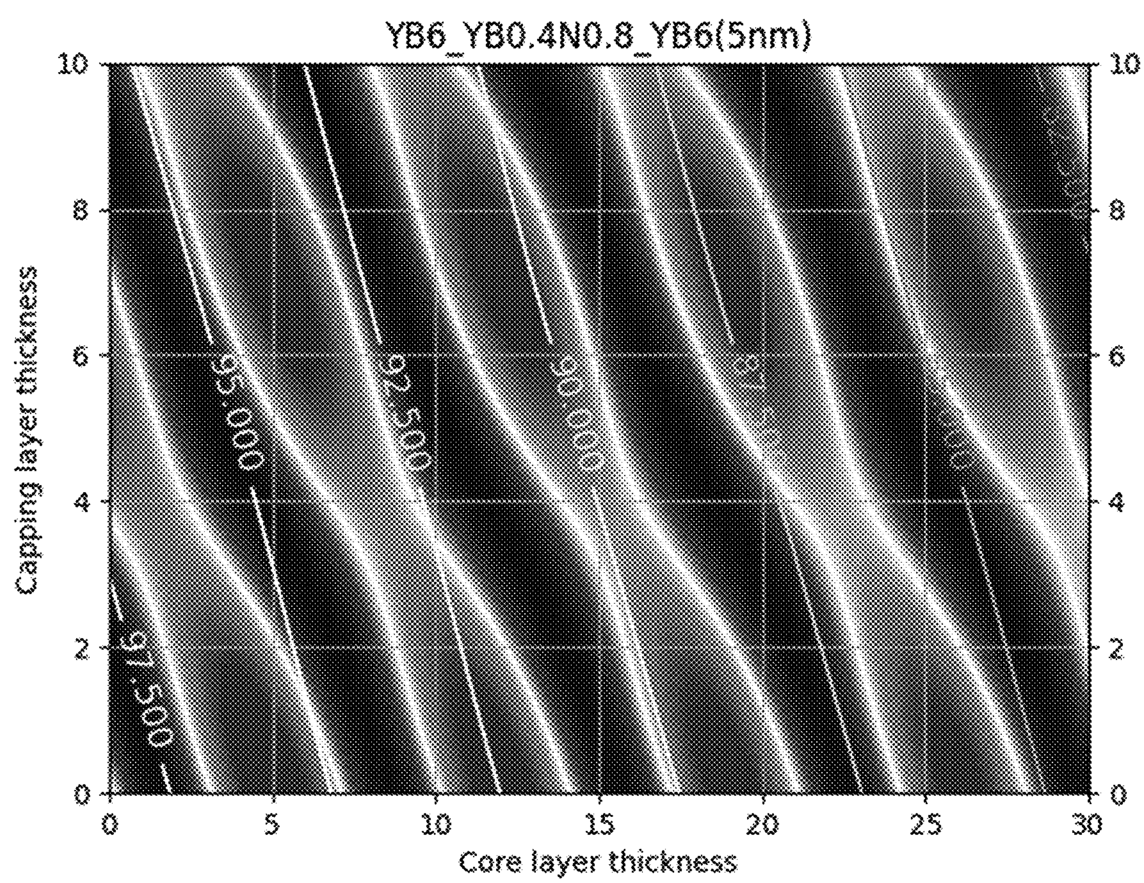

Referring to FIG. 33, the pellicle according to the twenty-ninth experimental example was expressed as "YB6_YB0.4N0.8_YB6(5 nm)".

When the thickness of the core layer is less than 18 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 34:
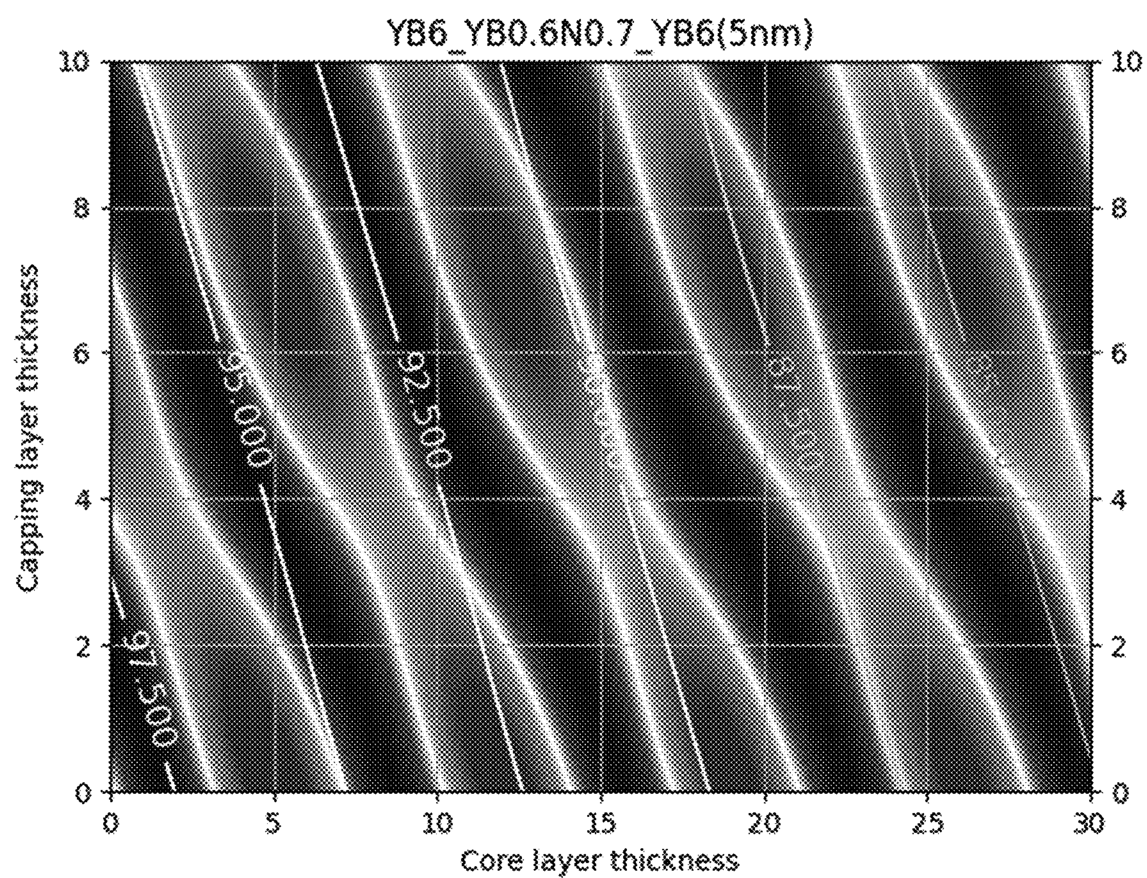

Referring to FIG. 34, the pellicle according to the thirtieth experimental example was expressed as "YB6_YB0.6N0.7_YB7(5 nm)".

When the thickness of the core layer is less than 19 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 35:
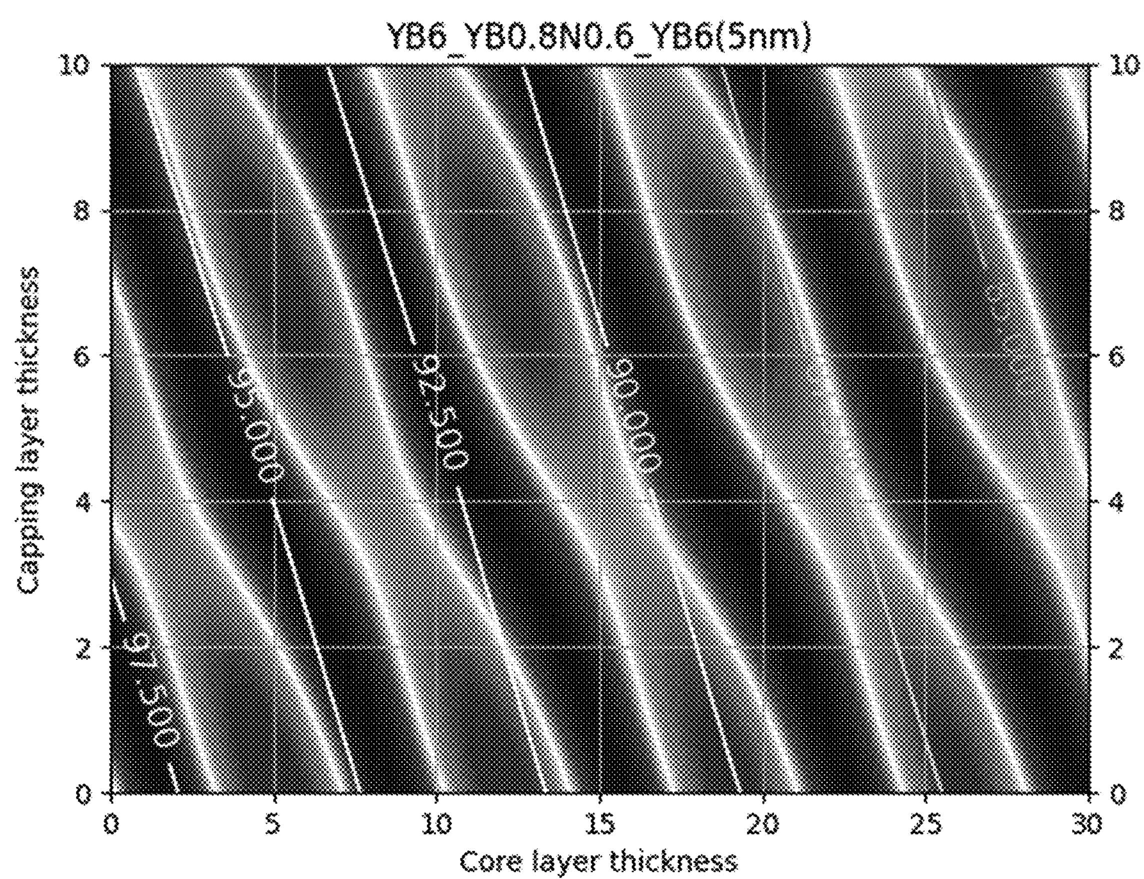

Referring to FIG. 35, the pellicle according to the thirty-first experimental example was expressed as "YB6_YB0.8N0.6_YB7(5 nm)".

When the thickness of the core layer is less than 20 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 36:
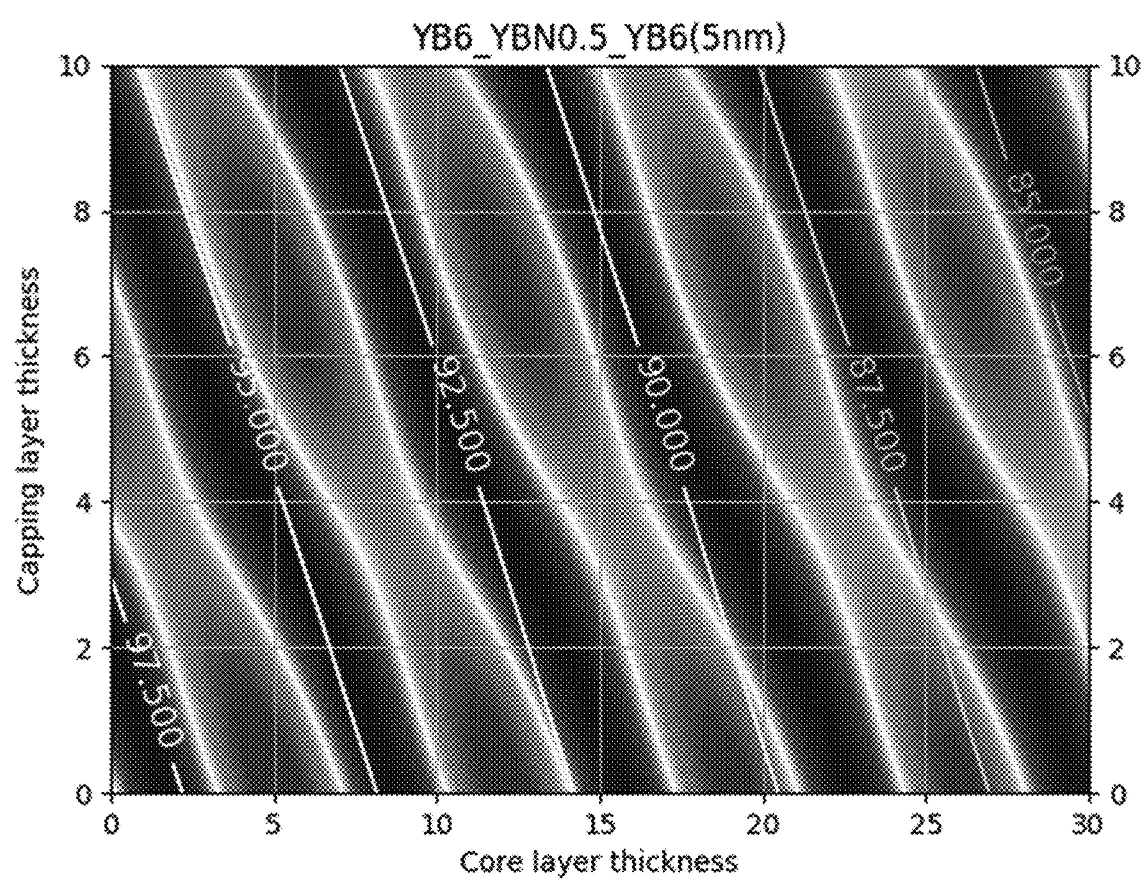

Referring to FIG. 36, the pellicle according to the thirty-second experimental example was expressed as "YB6_YB1.0N0.5_YB7(5 nm)".

When the thickness of the core layer is less than 21 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 37:
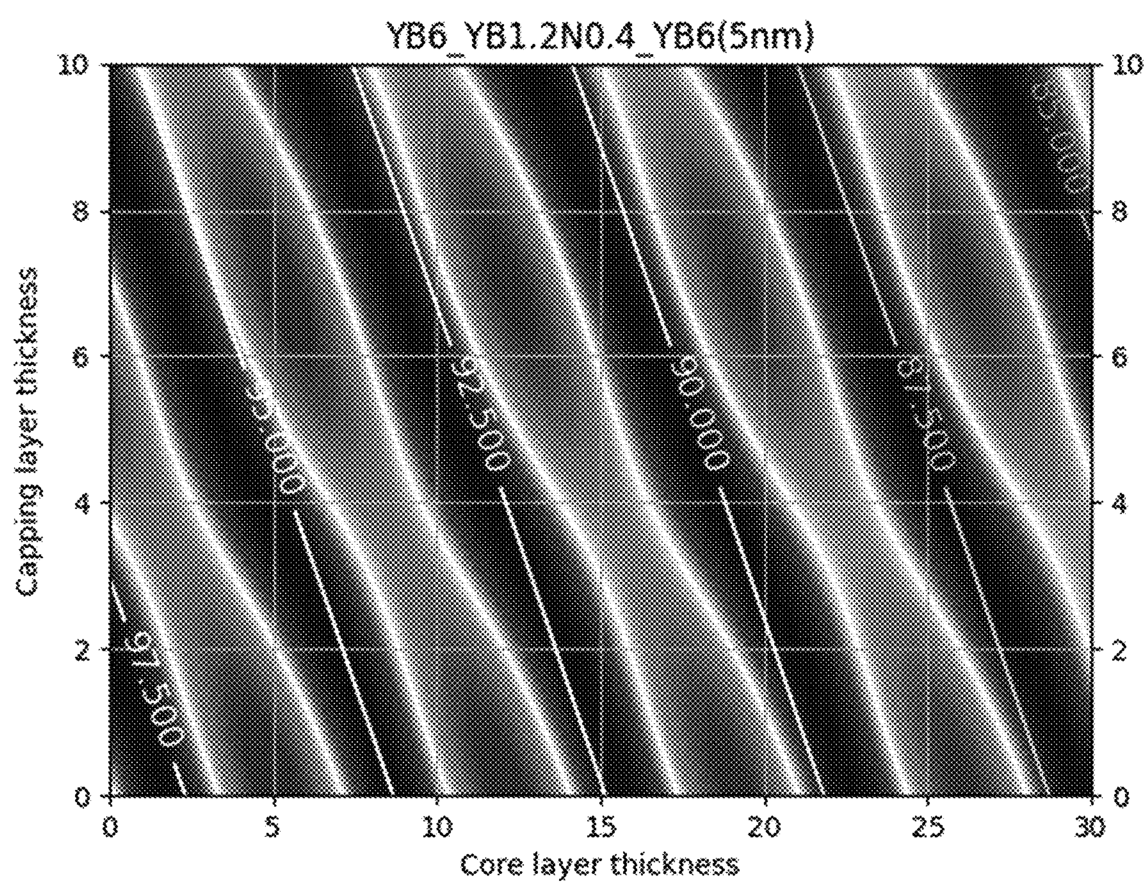

Referring to FIG. 37, the pellicle according to the thirty-third experimental example was expressed as "YB6_YB1.2N0.4_YB7(5 nm)".

When the thickness of the core layer is less than 23 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 38:
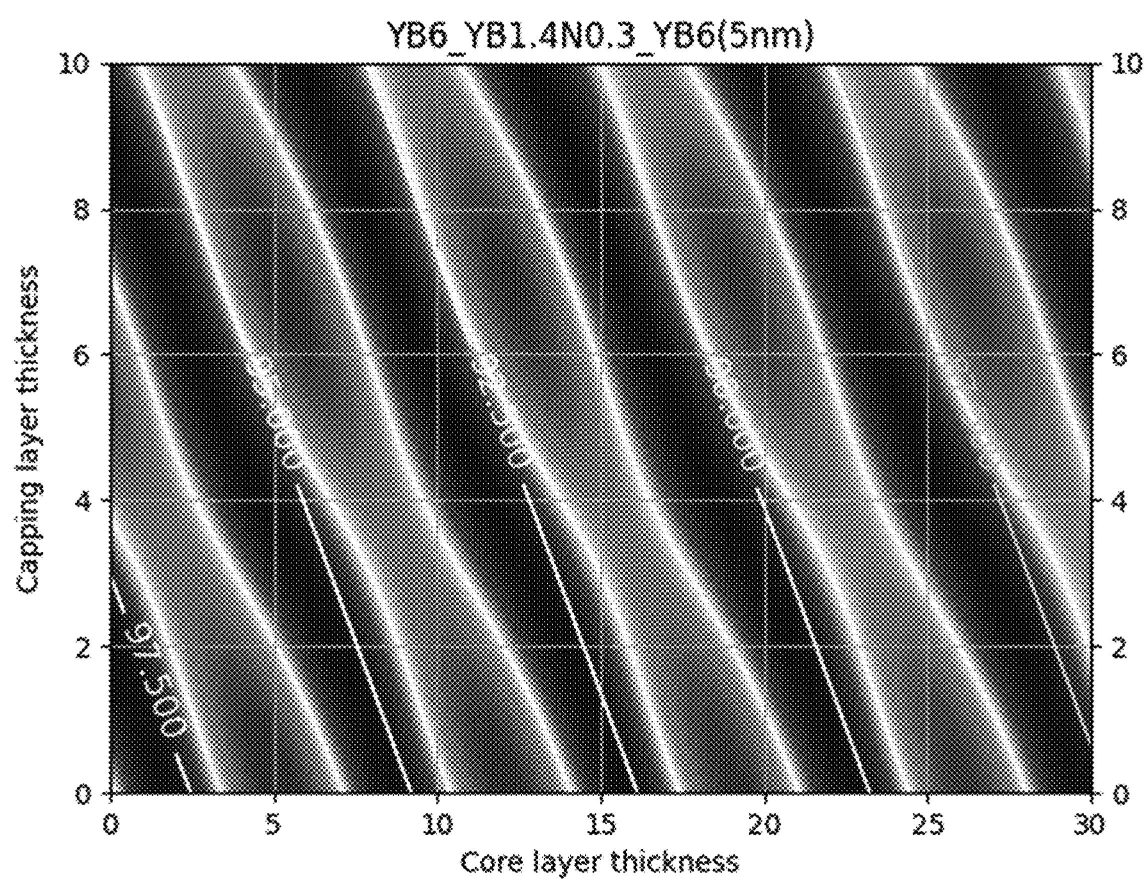

Referring to FIG. 38, the pellicle according to the thirty-fourth experimental example was expressed as "YB6_YB1.4N0.3_YB7(5 nm)".

When the thickness of the core layer is less than 24 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 39:
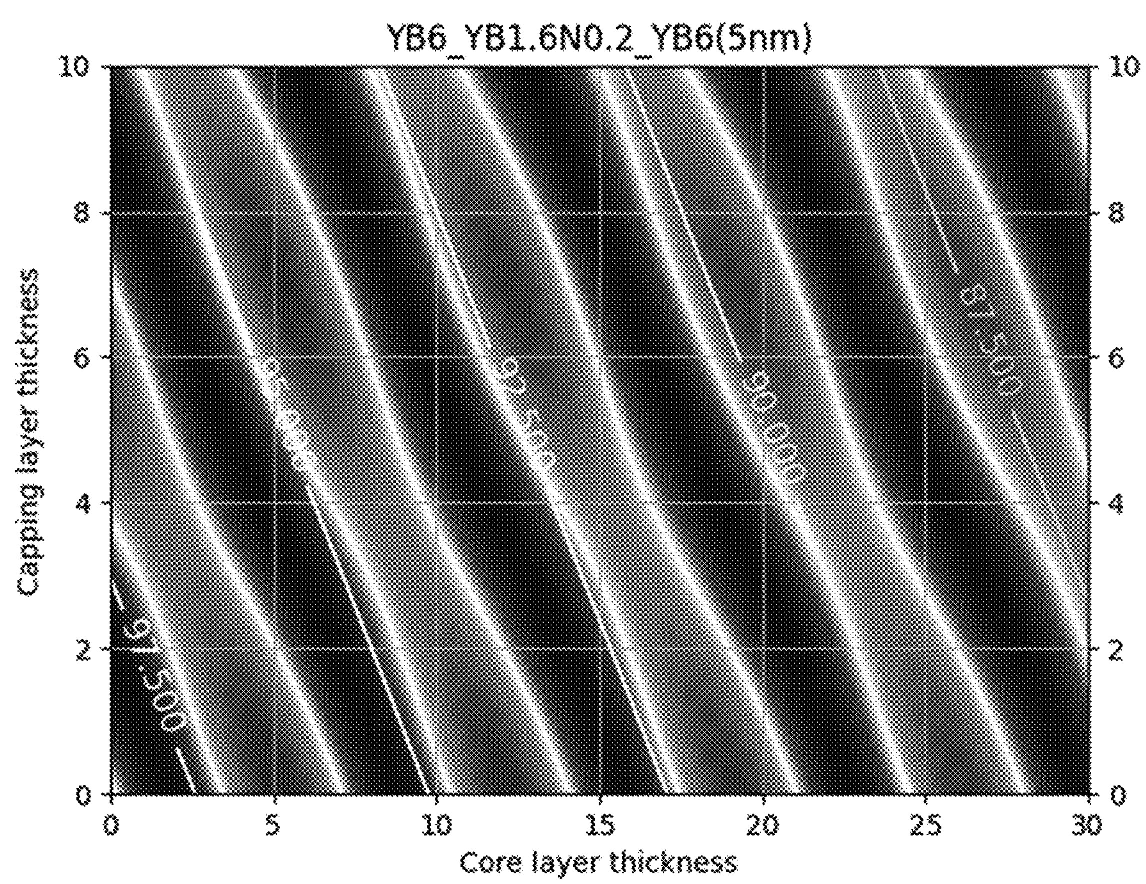

Referring to FIG. 39, the pellicle according to the thirty-fifth experimental example was expressed as "YB6_YB1.6N0.2_YB7(5 nm)".

When the thickness of the core layer is less than 25 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

Figure 40:
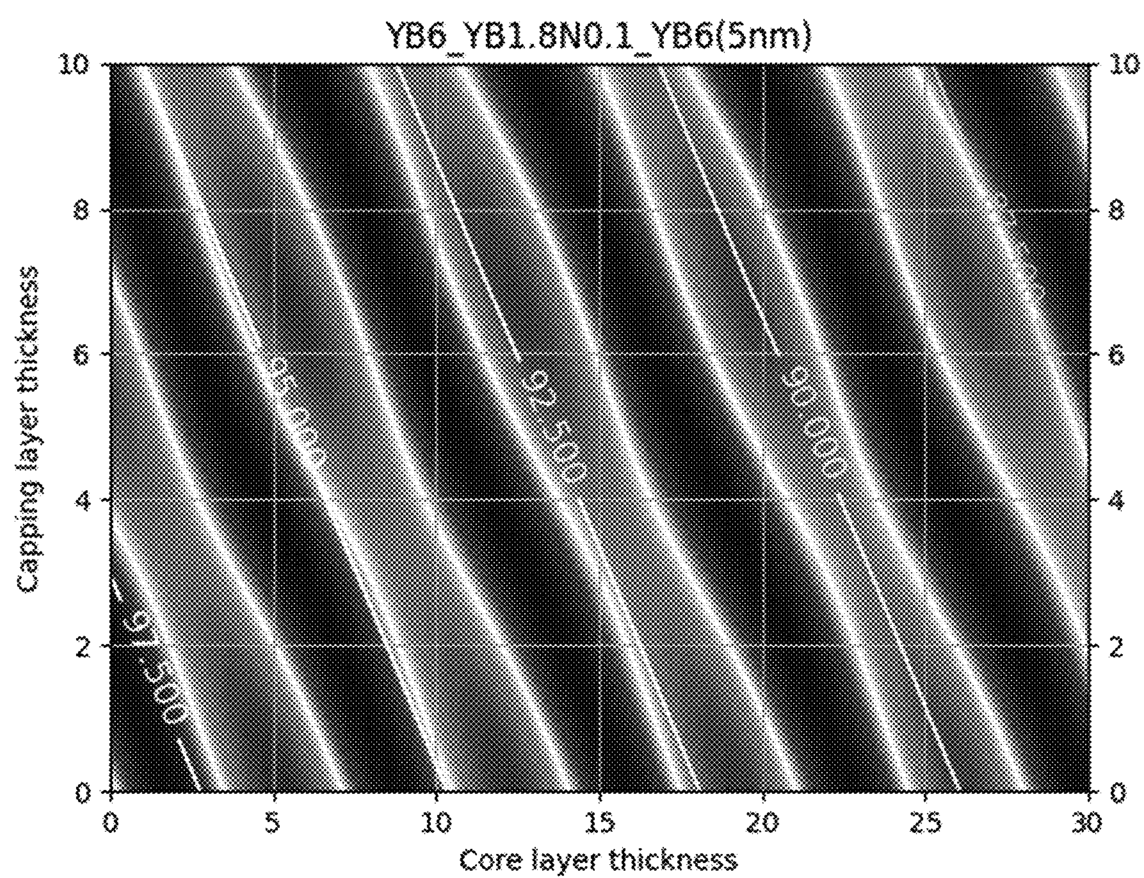

Referring to FIG. 40, the pellicle according to the thirty-sixth experimental example was expressed as "YB6_YB1.8N0.1_YB7(5 nm)".

When the thickness of the core layer is less than 27 nm and the thickness of the capping layer is 10 nm or less, the transmittance is 90% or more.

In some sections where the thickness of the core layer is 30 nm or less and the thickness of the capping layer is 10 nm or less, the reflectance is 0.04% or less. It can be seen that these sections where the reflectance is 0.04% or less appear in six regions narrowly in the oblique direction in the thickness graph of the core layer and the capping layer.

As such, according to the twenty-eighth to thirty-sixth experimental examples, in case of using $YB_{2x}N_{1-x}$ (0<x<1) as the material of the core layer and using $YB_6$ as the materials of the support layer and the capping layer, it can be seen that the pellicle having an extreme ultraviolet transmittance of 90% or more and having a reflectance of 0.04% or less is provided in some thicknesses where the thickness of the core layer is less than 27 nm and the thickness of the capping layer is 10 nm or less.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A pellicle for extreme ultraviolet lithography, the pellicle comprising:

a pellicle layer comprising an M-α compound in which Mis combined with α, wherein:

M comprises Si or Y, and

α comprises B and N.

2. The pellicle of claim 1, wherein the pellicle layer contains all of Si, B, N, and C.

3. The pellicle of claim 1, wherein the pellicle layer contains all of Y, B, N, O, and F.

4. The pellicle of claim 1, wherein the pellicle layer includes:

a support layer;

a core layer formed over the support layer; and a capping layer formed over the core layer, wherein the core layer is disposed between the support layer and the capping layer, wherein the core layer comprises the M-α compound.

5. The pellicle of claim 4, wherein the core layer comprises $SiB_xN_{1-x}$ (0<x<1), and each of the support layer and the capping layer comprises $SiN_x$(x≥1).

6. The pellicle of claim 4, wherein the core layer comprises $SiB_{6x}N_{1-x}$ (0<x<1), and each of the support layer and the capping layer comprises $SiN_x$(x≥1).

7. The pellicle of claim 4, wherein the core layer comprises $YB_{2x}N_{1-x}$ (0<x<1), and each of the support layer and the capping layer comprises $SiN_x$(x≥1).

8. The pellicle of claim 4, wherein the core layer comprises $YB_{2x}N_{1-x}$ (0<x<1), and each of the support layer and the capping layer comprises $YB_x$(x≥2).

9. The pellicle of claim 1, wherein the pellicle layer includes:

a support layer;

a core layer formed over the support layer;

an intermediate layer formed over one or both surfaces of the core layer; and a capping layer formed over the intermediate layer, wherein the core layer is disposed between the support layer and the capping layer, wherein the core layer comprises the M-α compound.

10. The pellicle of claim 1, further comprising:

a substrate having an opening formed in a central portion thereof, wherein the pellicle layer formed over the substrate and covering the opening.

11. The pellicle of claim 10, wherein the pellicle layer includes:

a support layer formed over the substrate to cover the opening;

a core layer formed over the support layer; and a capping layer formed over the core layer, wherein the core layer is disposed between the support layer and the capping layer, wherein the core layer comprises the M-α compound.

12. The pellicle of claim 10, wherein the pellicle layer includes:

a support layer formed over the substrate and covering the opening;

a core layer formed over the support layer;

an intermediate layer formed over one or both surfaces of the core layer; and a capping layer formed over the intermediate layer, wherein the core layer is disposed between the support layer and the capping layer, wherein the core layer comprises the M-$\alpha$ compound.

* * * * *